United States Patent [19]
Hazama et al.

[11] Patent Number: 5,486,896
[45] Date of Patent: Jan. 23, 1996

[54] EXPOSURE APPARATUS

[75] Inventors: Junji Hazama; Masamitsu Yanagihara, both of Yokohama; Hideji Goto, Kawasaki; Masaichi Murakami, Tokyo, all of Japan

[73] Assignee: Nikon Corporation, Tokyo, Japan

[21] Appl. No.: 195,192

[22] Filed: Feb. 14, 1994

[30] Foreign Application Priority Data

| Feb. 19, 1993 | [JP] | Japan | 5-030150 |
| Apr. 12, 1993 | [JP] | Japan | 5-084764 |
| Jun. 11, 1993 | [JP] | Japan | 5-140974 |

[51] Int. Cl.⁶ .................................................. G03B 25/72
[52] U.S. Cl. .................................................. 355/71; 355/53
[58] Field of Search ........................ 355/53, 67, 71, 355/74

[56] References Cited

U.S. PATENT DOCUMENTS

| 2,698,562 | 1/1955 | Freund | 355/40 |
| 4,920,364 | 4/1990 | Andrews et al. | 346/160 |
| 4,931,830 | 6/1990 | Suwa et al. | 355/71 |
| 5,208,629 | 5/1993 | Matsuo et al. | 355/53 |
| 5,264,898 | 11/1993 | Kanon et al. | 355/67 |
| 5,272,501 | 12/1993 | Nishi et al. | 355/53 |
| 5,285,236 | 2/1994 | Jain | 355/53 |
| 5,291,240 | 3/1994 | Jain | 355/53 |
| 5,306,585 | 4/1994 | Okamoto | 430/5 |
| 5,311,217 | 5/1994 | Guerin et al. | 346/108 |
| 5,324,600 | 6/1994 | Jinbo et al. | 430/5 |
| 5,329,333 | 7/1994 | Noguchi et al. | 355/53 |

FOREIGN PATENT DOCUMENTS 63-49218  10/1988  Japan .

Primary Examiner—Michael L. Gellner
Assistant Examiner—D. P. Malley
Attorney, Agent, or Firm—Shapiro and Shapiro

[57] ABSTRACT

An exposure apparatus adapted for use in manufacture of semiconductor devices or substrates for liquid crystal display panels, comprises an illumination systems for irradiating a first object with a light beam from a light source; a projection optical system for projecting the image of a pattern on the first object, illuminated by the light beam, onto a second object; and a light attenuation device provided in the illumination system and adapted to gradually decrease the amount of light in the peripheral portion of the image of the pattern, projected onto the second object, as the distance from the center of the image increases.

13 Claims, 20 Drawing Sheets

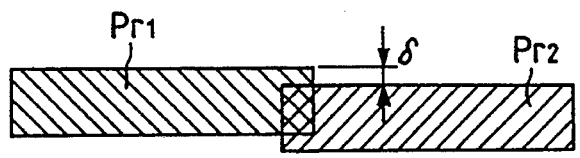
FIG. 9A   PATTERN COMPOSITION ACCORDING TO CONVENTIONAL METHOD
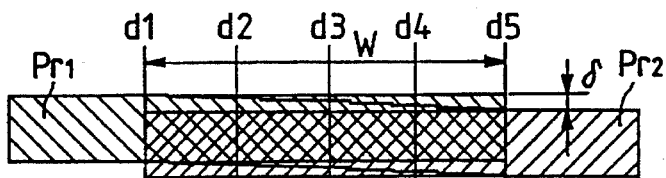
FIG. 9B   PATTERN COMPOSITION ACCORDING TO THE PRESENT INVENTION
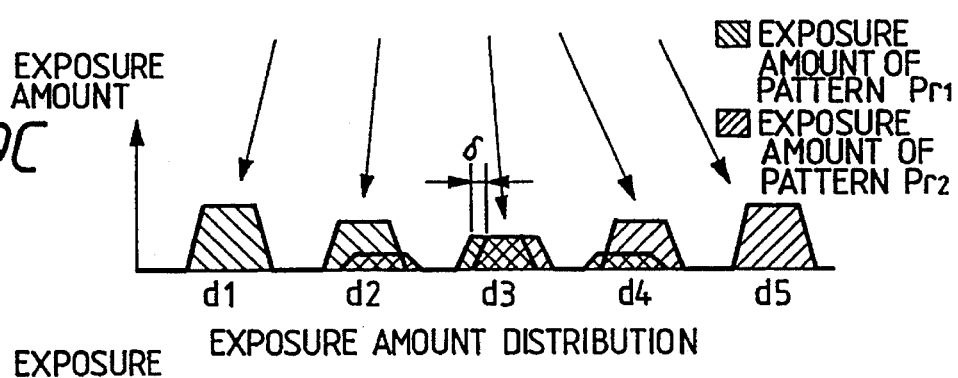
FIG. 9C   EXPOSURE AMOUNT DISTRIBUTION
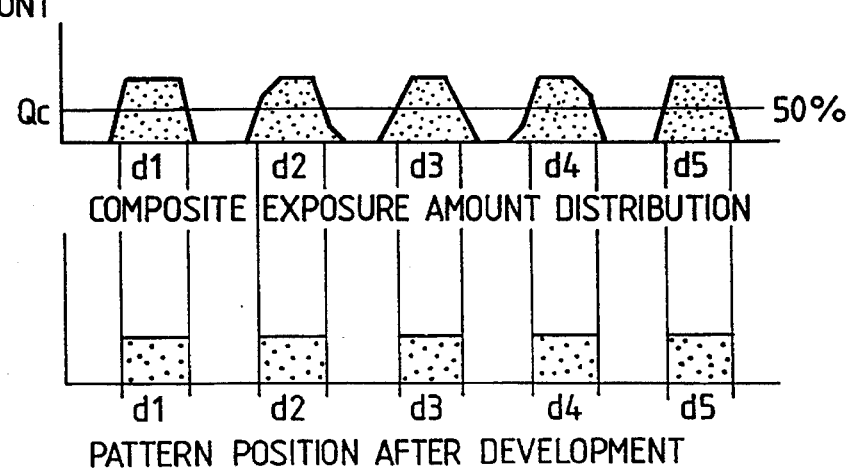
FIG. 9D   COMPOSITE EXPOSURE AMOUNT DISTRIBUTION
FIG. 9E   PATTERN POSITION AFTER DEVELOPMENT

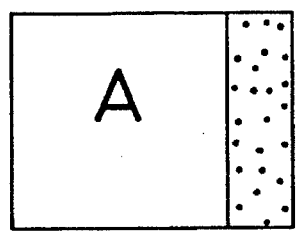
FIG. 16A
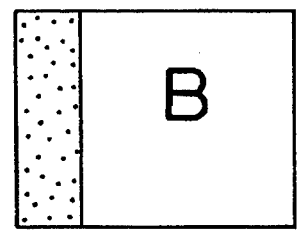
FIG. 16B
FIG. 16C
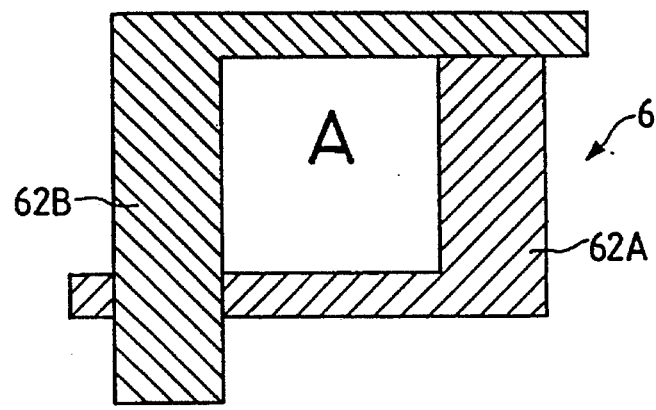
FIG. 16D
FIG. 16E
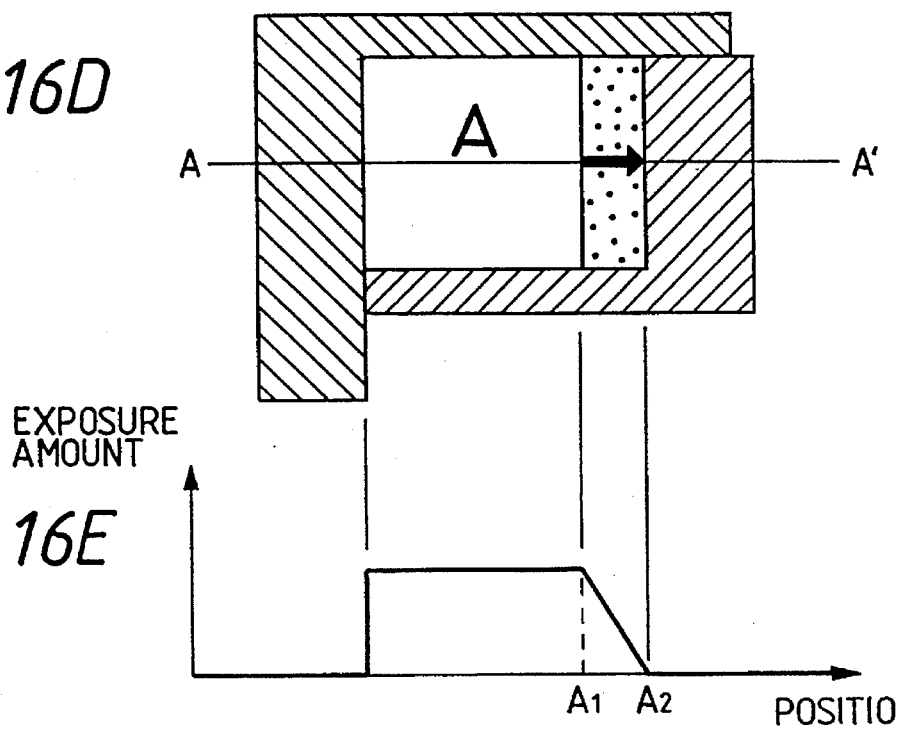

COMPOSITE SHOTS

EXPOSURE AMOUNT DISTRIBUTION

COMPOSITE EXPOSURE AMOUNT

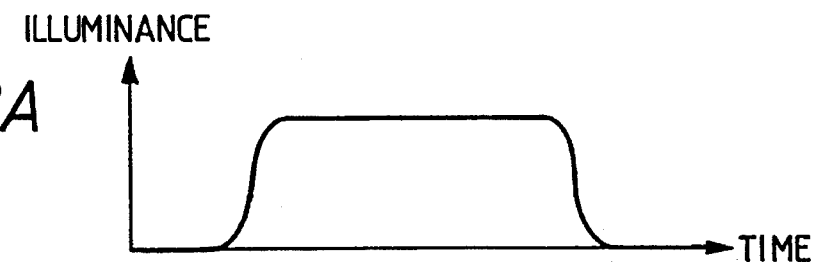
FIG. 18A
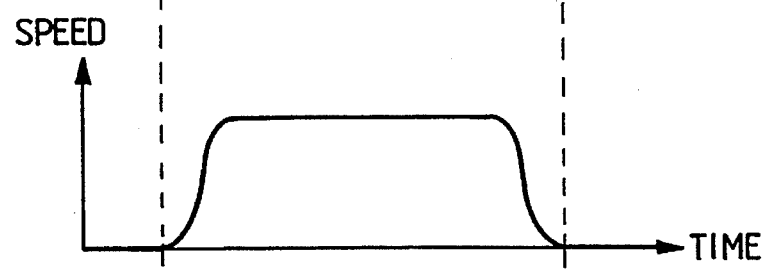
FIG. 18B
FIG. 19
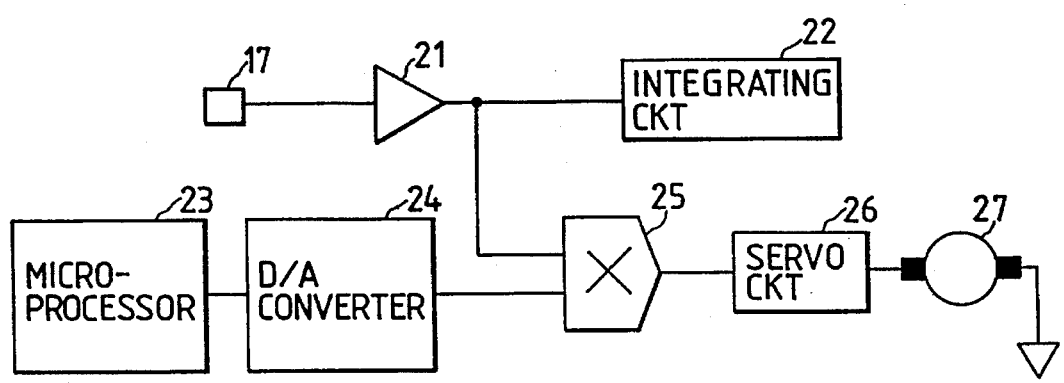

EXPOSURE APPARATUS

BACKGROUND OF THE INVENTION

1. Field of the Invention

The present invention relates to an exposure apparatus adapted for use in manufacture of semiconductor devices, substrates for liquid crystal display panels or the like, and more particularly to an exposure apparatus for effecting so-called image area synthesis or composition for forming a pattern of a large area by partially superposing patterns of a unit area on a photosensitive substrate.

2. Related Background Art

In such exposure apparatus, in order to meet the requirement for a size increase of the photosensitive substrate to be exposed, there is employed an image area synthesis method, in which the exposure area of the photosensitive substrate is divided into plural unit areas and exposures are executed in repeated manner, respectively corresponding to such unit areas to finally synthesize a desired pattern. In such image area synthesis method, in order to avoid pattern discontinuity at the boundary of the unit exposure areas, possibly resulting from the error in patterning on the reticle for pattern projection, optical aberrations in the projection optical system and alignment error of the stage for positioning the photosensitive substrate, exposures of the unit areas are executed with mutual overlapping by a small amount at the boundary. However, such overlapping of the exposure areas gives a doubled exposure to the overlapping area, possibly resulting in a variation in the pattern line width in the pattern junction area, depending on the properties of the photosensitive material employed. Also such image area synthesis may generate a step difference at the junction of patterns, due to the positional aberration between the adjacent exposure areas, eventually deteriorating the properties of the device to be produced. Furthermore, if such pattern, obtained by the image area synthesis method, is overlaid in plural layers, with respectively different exposure apparatus, the error in overlapping of the exposure areas fluctuates in different manners at the pattern junctions in different layers, due to the difference in the lens aberrations and in the alignment precision in different exposure apparatus. Particularly in case of an active matrix liquid crystal display device, such phenomenon leads to a discontinuous variation of the image contrast at the junction of the patterns, thus significantly deteriorating the quality of the display device.

For avoiding such drawback in the image area synthesis, the Japanese Patent Publication No. 63-49218 discloses a method of providing the reticle or a filter overlaid thereon, with light attenuating means for reducing the amount of transmitted light in a position corresponding to the pattern junction, thereby reducing the amount of exposure in the overlapping portion of the patterns substantially equal to that in other areas.

However, such known method is associated with the following drawbacks. In case such light attenuating property is given to the reticle itself, it increases the burden to the preparation of the reticle, for example because of the increased number of steps required for the preparation and the increased probability of pattern defect generation in the course of preparation. On the other hand, in case such property is given to the filter to be overlaid on the reticle, the maintenance of the reticle becomes more difficult as the attaching and detaching of such filter increases the probability of damage and contamination of the reticle. Also as the reticle is usually provided, on both sides thereof, with pellicles of a certain thickness in order to prevent deposition of dust or the like onto the reticle pattern, the filter and the reticle pattern are inevitably separated by the thickness of the pellicle at minimum, so that the ideal light attenuating characteristics are difficult to attain on the reticle pattern. Besides an exclusive filter has to be prepared for each reticle, and considerable work will be inevitable for the preparation and maintenance of such filters.

SUMMARY OF THE INVENTION

In consideration of the foregoing, an object of the present invention is to provide an exposure apparatus capable of providing ideal light attenuating characteristics on the pattern transferring original such as a reticle, without providing such original itself with the light attenuating property or without requiring light attenuating means different for respective originals.

The present invention is applicable to an exposure apparatus provided with illumination means; a projection optical system for guiding the illuminating light from said illumination means to a first object and projecting a pattern, formed on said first object, onto a second object; and light attenuation means for decreasing the amount of light in the peripheral area of an image of the pattern, projected onto the second object, as the distance from the center of said pattern image increases.

The above-mentioned object can be attained by an exposure apparatus comprising imaging means provided between the light attenuation means and the first object and adapted to form an image of the light attenuation means on the first object, and attenuation position regulating means for regulating the position of light attenuation by the light attenuation means on the first object.

The light attenuating characteristics of the light attenuation means are so determined that, when plural patterns are projected onto the second object by displacements of the respective projecting position with mutual overlapping in the peripheral area of the images of said patterns, the amount of light in the overlapping portion of the pattern images becomes approximately equal to that outside such overlapping portion.

The light attenuating means can be composed, for example, of a filter which is provided at the periphery of an aperture transmitting the illuminating light from the illumination means and of which transmittance decreases as the distance from the center of the aperture increases.

Consequently, the image of the light attenuating means is formed by the imaging means on the first object, and the amount of light in the peripheral portion of the illuminated area on the first object decreases precisely according to the light attenuating characteristics of the light attenuating means. The area of light attenuation can be regulated according to the size of the first object or the variation in the illuminated area on said first object.

Consequently, when the exposure areas are made to mutually overlap in the peripheral portions, the amount of synthesized exposures in the overlapping portion becomes approximately equal to the amount of exposure in other areas.

Also there is provided an exposure apparatus provided with an illuminating optical system for irradiating a reticle with a light beam from a light source; illumination area setting means provided in a position, substantially conjugate with the reticle, within the illumination optical system and adapted to arbitrarily set the area to be illuminated by the light beam on the reticle; and exposure means for exposing a photosensitive substrate to the image of a pattern formed on the reticle; and adapted to effect exposures on different areas on the photosensitive substrate by forming the images of the patterns in such a manner that said images partially overlap mutually, comprising control means for controlling the illumination area setting means in such a manner that the amount of light in a part of the image varies substantially continuously in the course of exposure.

There is furthermore provided an exposure apparatus provided with an illumination optical system for irradiating a reticle with a light beam from a light source; a field diaphragm device provided in a position substantially conjugate with the reticle and adapted to arbitrarily set the reticle area to be illuminated by the light beam; and exposure means for exposing a photosensitive substrate to the image of a pattern formed on the reticle, and adapted to effect exposures on different areas on the photosensitive substrate by forming the images of the patterns in such a manner that said images partially overlap mutually, comprising field diaphragm control means for displacing the position of the edge of the field diaphragm device in synchronization with the exposure thereby varying the amount of light in the peripheral portion of the image on the photosensitive substrate.

Such means for continuously varying the illumination area on the reticle, within a range corresponding to the overlapping portion of the image of the reticle, in the course of exposure to the photosensitive substrate, causes a continuous variation in the amount of exposure in the overlapping portion of the images on the photosensitive substrate.

The present invention is furthermore applicable to an exposure apparatus provided with an illumination optical system for guiding a light beam from a light source onto a reticle; a diaphragm member for defining the illumination area of the reticle by said light beam by regulating the area of the aperture transmitting the light beam; and a projection optical system for projecting a pattern on the reticle, illuminated by the light beam, onto a photosensitive substrate, and adapted to effect exposures in different areas on the photosensitive substrate with mutual overlapping of the peripheral portions of the images of the pattern.

The aforementioned object can be attained by the presence of cumulative exposure detecting means for detecting the cumulative amount of exposures of the photosensitive substrate in respective exposures, and diaphragm control means for varying the position of a diaphragm member in the course of exposure, based on the cumulative amount of exposure detected by the cumulative exposure detecting means, in such a manner that the amount of exposure in the overlapping portion of the images of the patterns is attenuated according to predetermined light attenuating characteristics.

Furthermore, the diaphragm control means is provided with target position designating means for designating the target position of the diaphragm member in the course of exposure corresponding to the cumulative amount of exposure detected by the cumulative exposure detecting means, and diaphragm driving means for moving the diaphragm member to the designated target position.

When the position of the diaphragm member varies in the course of exposure, there results a variation in the illuminated area, defined by the diaphragm member, on the reticle, and the amount of exposure in the peripheral portion of the exposure area on the photosensitive substrate decreases corresponding to said variation. The present invention utilizes such effect and decreases the amount of exposure in the overlapping portion of the images of the patterns on the photosensitive substrate according to predetermined light attenuating characteristics, by varying the position of the diaphragm member in the course of exposure based on the cumulative amount of exposure.

Since the target position of the diaphragm member is designated according to the cumulative amount of exposure and the diaphragm member is moved to such designated target position, the driving speed of the diaphragm member is regulated according to the eventual fluctuation in the intensity of the illuminating light on the reticle, whereby there can be prevented the variation in the light attenuating characteristics resulting from fluctuation in the illumination intensity. Also as the diaphragm member is moved to the target position designated according to the cumulative amount of exposure, there will not result a cumulative error in the speed of the drive control system for the diaphragm member.

BRIEF DESCRIPTION OF THE DRAWINGS

FIGS. 9A to 9E are views showing the reason of step difference disappearance at the pattern junction;

FIGS. 16A to 16E are views showing the positional relationship between the reticle and the blades for effecting the image area synthesis;

FIG. 18A is a chart showing the output of a cumulative exposure meter of the exposure apparatus shown in FIG. 14;

FIG. 18B is a chart showing the variation of the moving speed of reticle blinds in the exposure apparatus shown in FIG. 14;

FIG. 19 is a block diagram showing a variation of the control system for moving the reticle blind;

DESCRIPTION OF THE PREFERRED EMBODIMENTS

Figure 1:
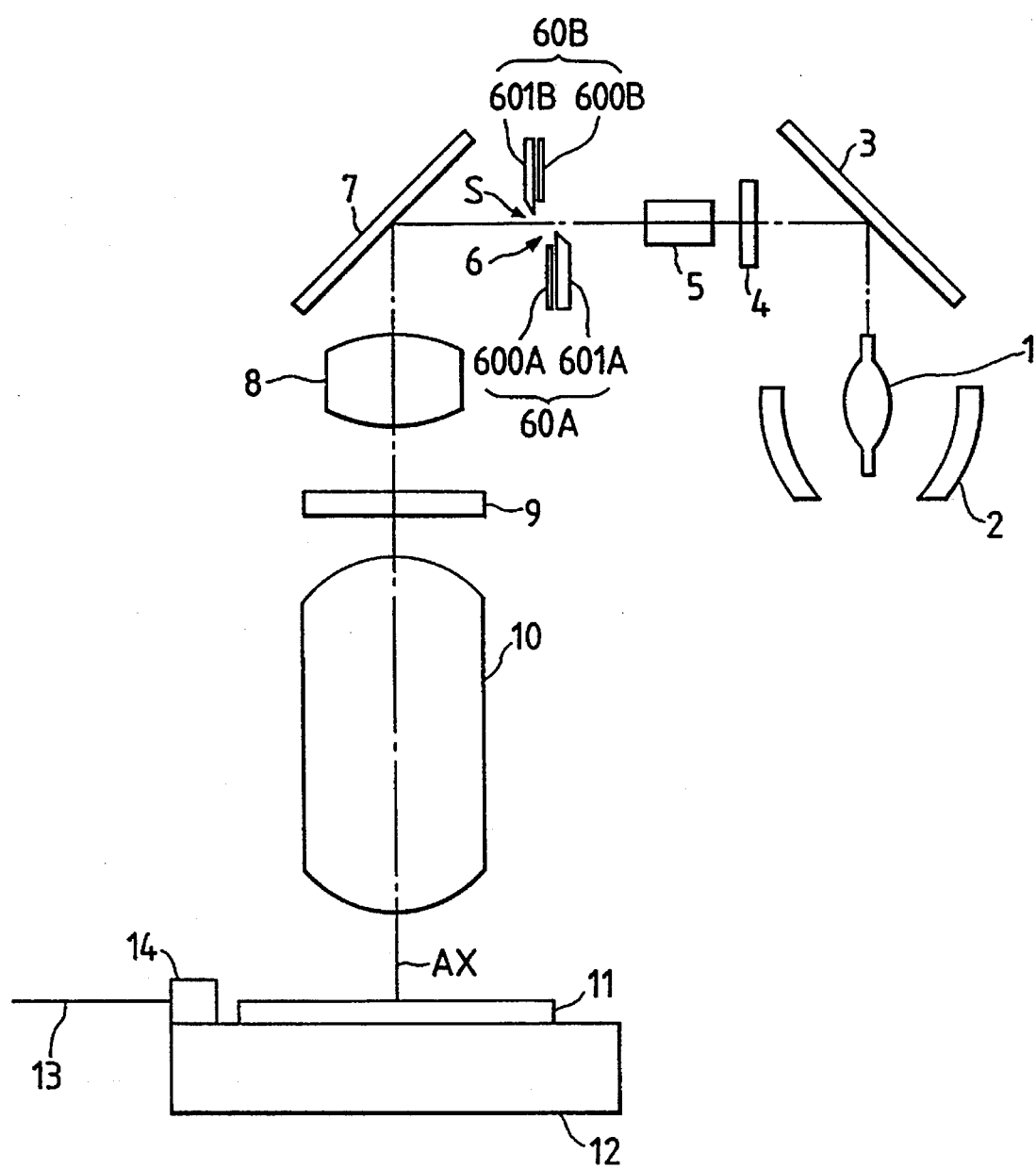
FIG. 1 is a schematic view of an exposure apparatus constituting a first embodiment of the present invention.

FIG. 1 is a schematic view of an exposure apparatus constituting a first embodiment of the to present invention, wherein the illuminating light from an ultra high pressure mercury lamp 1 constituting the exposure light source is condensed by an elliptical mirror 2, then reflected by a mirror 3 and enters a wavelength selecting filter 4, which only transmits the light of a wavelength (generally that of g- or i-line) required for exposure. The illuminating light transmitted by the wavelength selecting filter 4 is formed as a light beam of uniform illumination intensity by a fly's eye integrator 5, and reaches a reticle blind 6, which regulates the irradiation area by the illuminating light, by the variation of the size of an aperture S, as will be explained later in detail.

The illuminating light transmitted by the aperture S of the reticle blind 6 is reflected by a mirror 7 and enters a lens system 8, which forms an image of the aperture S of the reticle blind 6 on a reticle (first object) 9, thereby illuminating a desired area of the reticle 9 (by an illumination optical system 1–5, 7, 8. An image of a pattern present in the illuminated area of the reticle 9 is formed, by a projection lens 10, (projection optical system) onto a photosensitive substrate (second object) 11, whereby a specified area thereof is exposed to the pattern of the reticle 9. Said photosensitive substrate 11 is a wafer in case of a manufacturing process for a semiconductor integrated circuit, or a glass plate in case of a manufacturing process for a liquid crystal display device.

The photosensitive substrate 11 is fixed on a stage 12, which is of a known structure composed of a pair of blocks (stepping means) respectively movable in mutually orthogonal directions and which adjust the position of the photosensitive substrate 11 in the horizontal plane. In case of the image area synthesis, after an exposure, the reticle 9 is replaced by another and the stage 12 is so driven as to set another position of the photosensitive substrate 11 for the next exposure area, and the entire area of the photosensitive substrate 11 is exposed by repeating the above-explained procedure after each exposure. The image area synthesis may also be attained by forming plural patterns on a reticle or reticles and suitably varying the illuminated area within the reticle in linkage with the alteration of the exposure area on the photosensitive substrate 11.

The position of the stage 12 is detected by an unrepresented laser interferometer which emits a laser beam 13 toward a movable mirror 14 fixed on the stage 12 and measures the distance based on the interference between the incident light and the reflected light.

Figure 2:
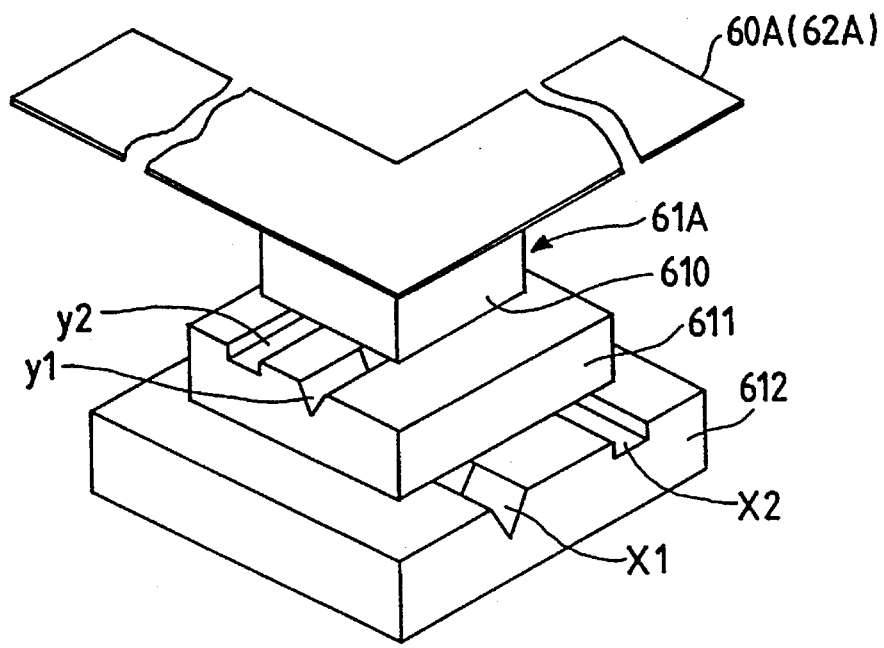
FIG. 2 is a perspective view of one of reticle blinds in the above-mentioned embodiment.
Figure 3:
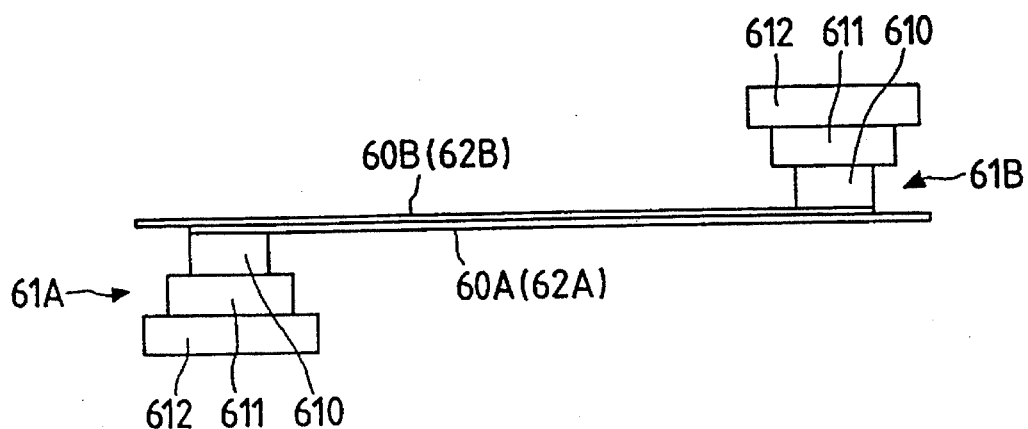
FIG. 3 is a lateral view of the reticle blinds of the above-mentioned embodiment.

As shown in FIGS. 1 to 4, the reticle blind is provided with a rectangular aperture S defined by a pair of L-shaped blades 60A, 60B combined in a direction perpendicular to the optical path of the illuminating light, and the size of said aperture S can be varied by the position adjustment of the blades 60A, 60B by driving mechanisms 61A, 61B (light attenuation position regulating means). As shown in FIGS. 2 and 3, the driving mechanism 61A or 61B is composed of a first block 610 on which the blade 60A or 60B is fixed, and second and third blocks 611, 612 placed in superposed relationship therewith, and, by means of an unrepresented feeding mechanism consisting of a servo motor and a ball screw, the first block 610 is moved along guide grooves y1, y2 while the second block 611 is moved along guide grooves x1, x2, whereby the blades 60A, 60B are moved in a plane perpendicular to the optical path (optical axis AX) of the illuminating light. As shown in FIG. 3, the driving mechanisms 61A, 61B are positioned in mutually opposite relationship with respect to the blades 60A, 60B, and the third blocks 612 of the above-mentioned mechanisms are integrally fixed, by means of an unrepresented frame, to the main body (not shown) of the exposure apparatus. Although FIG. 2 only illustrates the driving mechanism 61A for the blade 60A, the other mechanism 61B for the other blade 60B has the identical structure.

Figure 4:
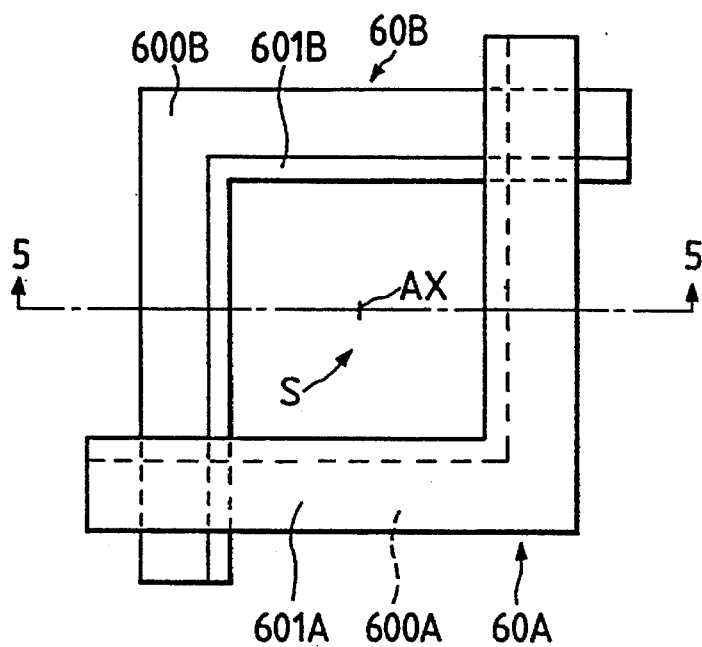
FIG. 4 is a plan view of the reticle blinds of the above-mentioned first embodiment.
Figure 5:
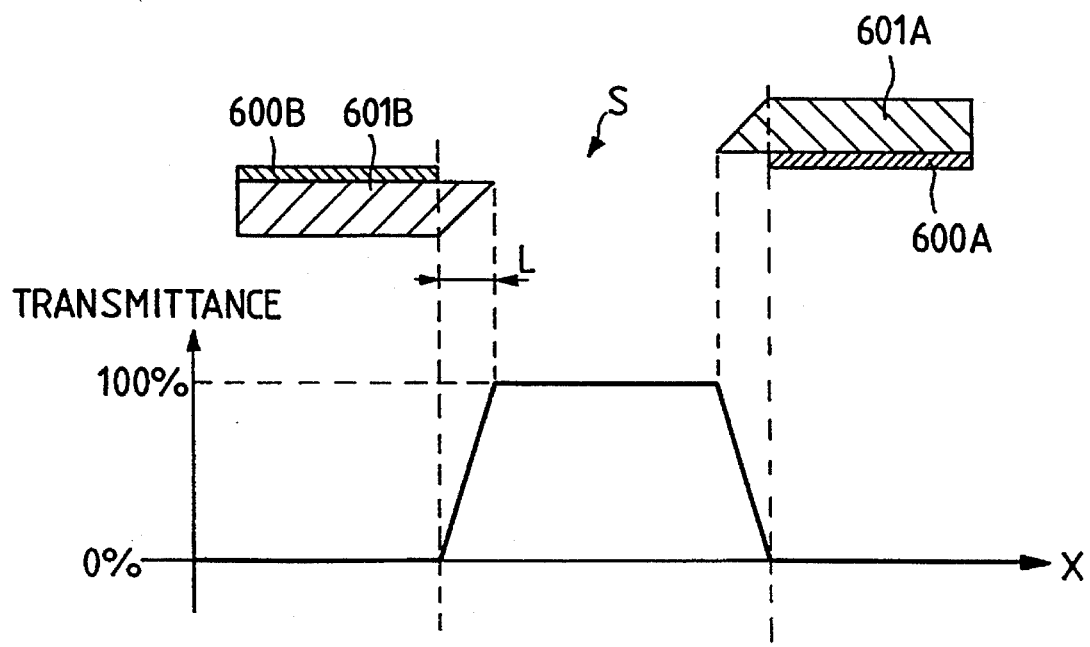
FIG. 5 is a view showing the cross section along a line 5—5 in FIG. 4 and the transmittance on said cross section.

As shown in FIGS. 1, 4 and 5, the blades 60A, 60B are composed of light shield plates 600A, 600B and ND filters 601A, 601B (light attenuation means) which are integrally fixed thereon and of which ends at the aperture S somewhat protrude from the light shield plates 600A, 600B. As shown in FIG. 5, the portions of the ND filters 601A, 601B (light absorbing members) protruding from the light shield plates 600A, 600B are formed triangularly in cross section, becoming thinner as the distance from the light shield plates 600A, 600B increases, whereby the transmittance of the reticle blind is 100% on the aperture S, then gradually decreases on the peripheral area of the aperture S as the distance from the center thereof increases, and reaches 0% at the position of the edges of the light shield plates 600A, 600B.

The protruding amount $L_1$ of the ND filters 601A, 601B from the light shield plates 600A, 600B is maintained constant around the entire periphery of the aperture S, whereby the light attenuating characteristics in the peripheral portion of the aperture S are maintained constant along the entire periphery, except for the diagonal corner portions of the aperture S where the ND filters 601A, 601B mutually overlap. The appropriate dimension of the protruding amount $L_1$ will be explained later. The above-mentioned protruding amount $L_1$ needs only to be equal on the mutually opposed sides of the aperture S.

Figure 6A:
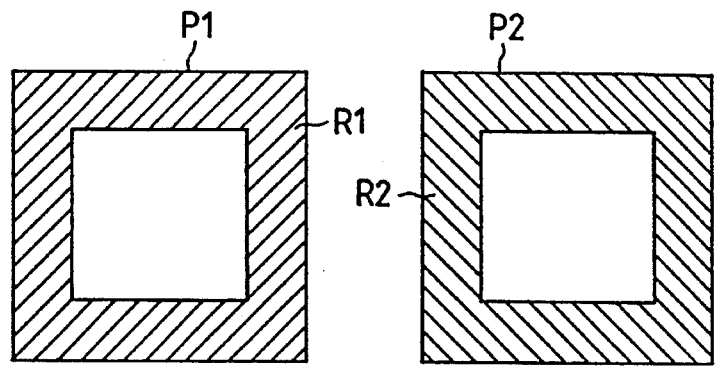
FIGS. 6A to 6D are views showing exposed images on the photosensitive substrate and the amounts of exposure thereof.
Figure 6B:
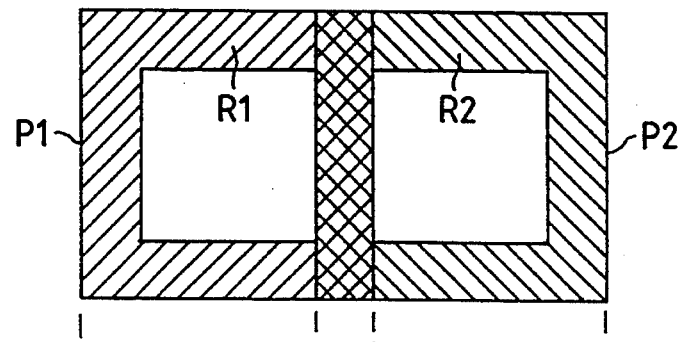
Figure 6C:
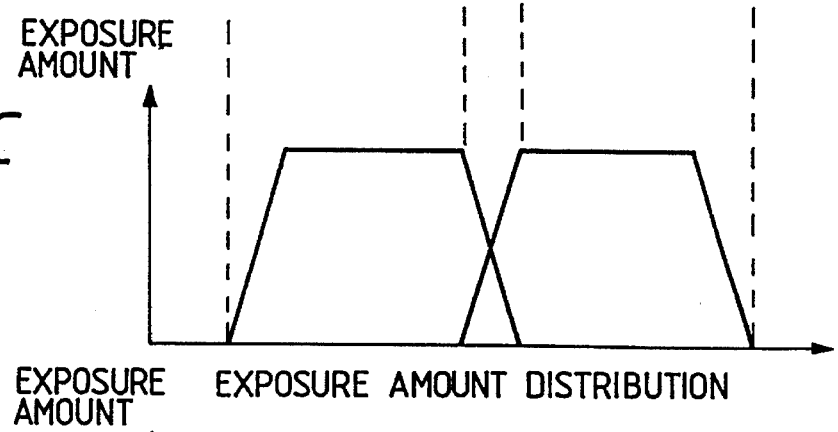
Figure 6D:
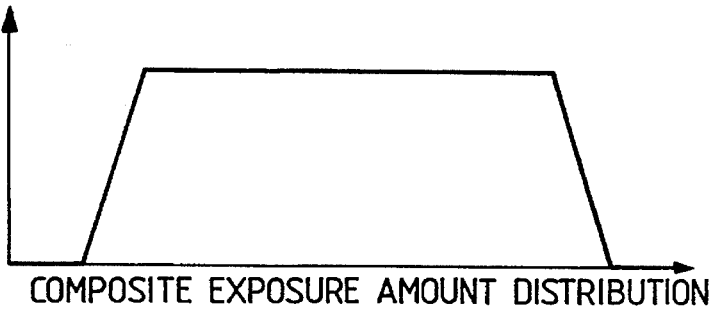

FIGS. 6A to 6D show the exposed image and the distribution of the exposure amount on the photosensitive substrate 11, when exposure is conducted with a suitable size of the aperture S of the reticle blind 6 and without the reticle 9. When plural exposures are conducted with completely separate exposure positions as shown in FIG. 6A, the rectangular exposed images P1, P2 formed on the photosensitive substrate 11 are respectively associated, along the entire peripheries thereof, with light attenuated portions R1, R2 in which the amount of exposure is reduced by the ND filters 601A, 601B. When the exposures are executed in such a manner that the light attenuated areas R1, R2 mutually overlap as shown in FIG. 6B, the exposure in one of such areas compensates the decrease in exposure of the other area as shown in FIG. 6C, so that the synthesized or composite exposure amount in the overlapping portion of the light attenuated areas R1, R2 coincides, as shown in FIG. 6D, with the exposure amount in the area not affected by the ND filters 601A, 601B.

In the following there will be explained the procedure of image area synthesis with the exposure apparatus of the present embodiment.

Figure 7:
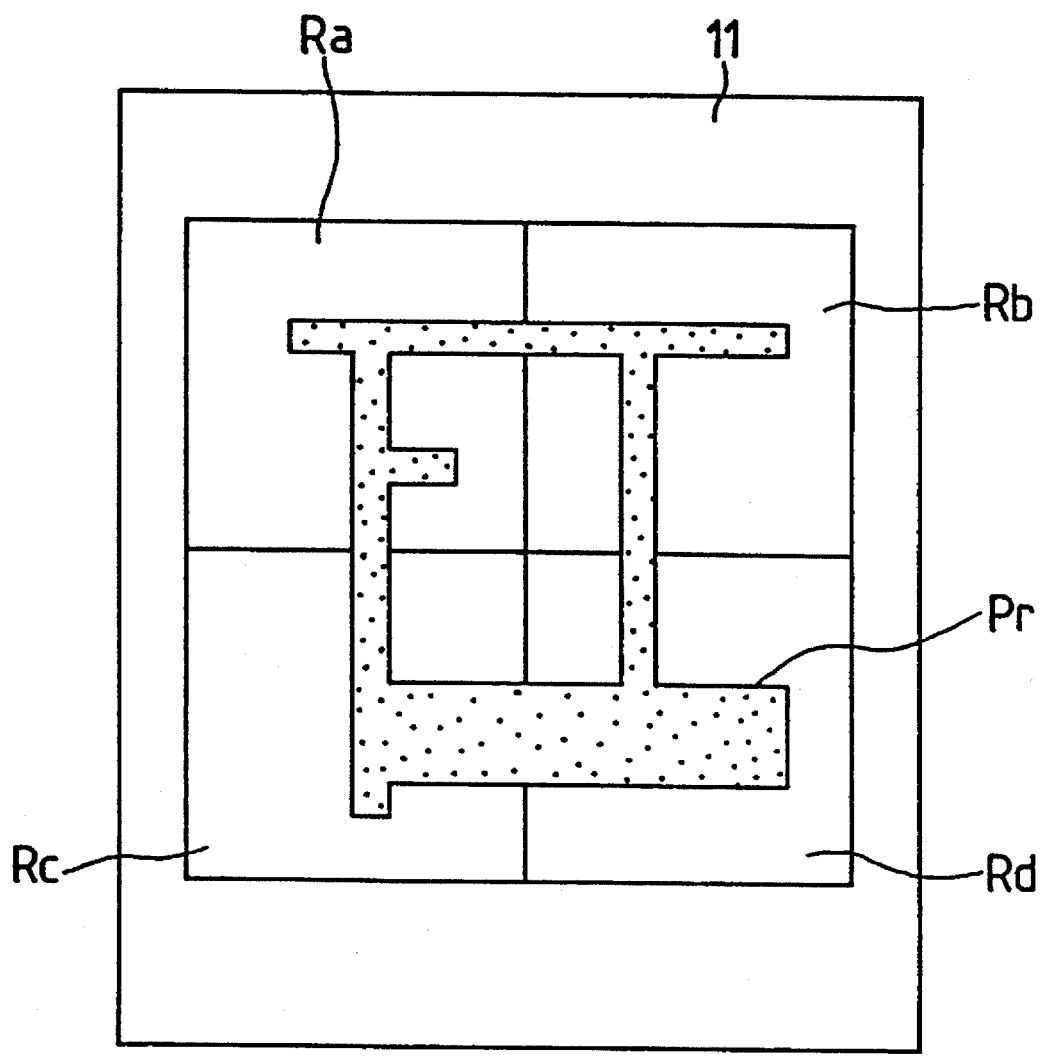
FIG. 7 is a view showing an example of image area synthesis.

FIG. 7 illustrates an example of synthesizing a pattern Pr by dividing the photosensitive substrate 11 into four rectangular exposure areas Ra–Rd, and for such purpose, there are employed, in succession, four reticles 9a–9d, shown in FIGS. 8A to 8D, respectively corresponding to the exposure areas Ra–Rd. The reticles 9a–9d are so patterned that the overlapping portions only at the image area synthesis have identical patterns.

Around each of the reticles 9a–9d, there is formed a light shield zone IB of a transmittance of 0%, capable of completely intercepting the incident light. Though not illustrated in FIG. 7, the exposure areas Ra–Rd are made to mutually overlap at the boundaries thereof by a desired amount (equal to the aforementioned protruding amount $L_1$ or a width W to be explained later), and the blades 60A, 60B of the reticle blind 6 are so positioned at each exposure that the light attenuation areas obtained by the ND filters 601A, 601B coincide with the overlapping portions of the exposure areas Ra–Rd.

Figure 8A:
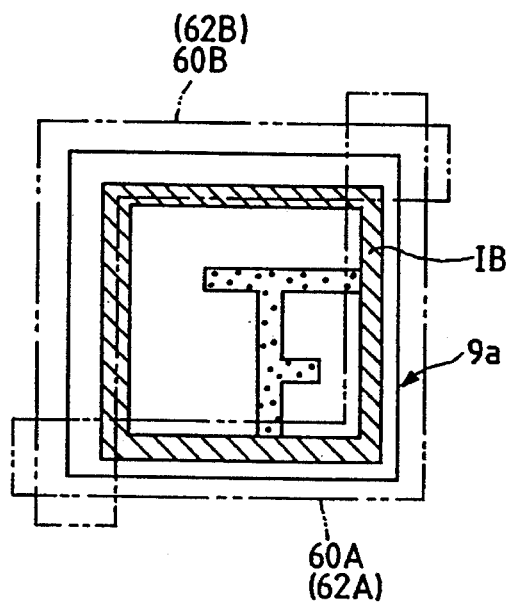
FIGS. 8A to 8D are views showing the positional relationship between the reticle and the blades for effecting the image area synthesis shown in FIG. 7.

More specifically, for exposing the upper left exposure area Ra shown in FIG. 7, the blade 60A, positioned at the right and lower sides of the reticle 9a, is so positioned that the light attenuating areas thereof protrude from the light shield zone IB, while the blade 60B, positioned at the left and upper sides of the reticle 9a, is so positioned as to be completely hidden by the light shield zone IB, as shown in FIG. 8A.

Figure 8B:
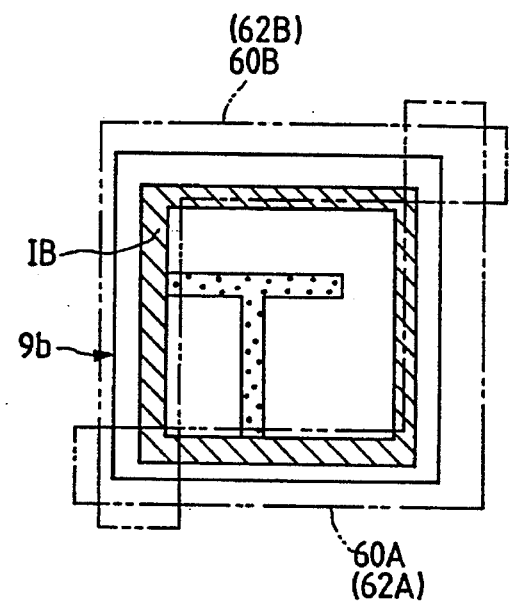
Figure 8C:
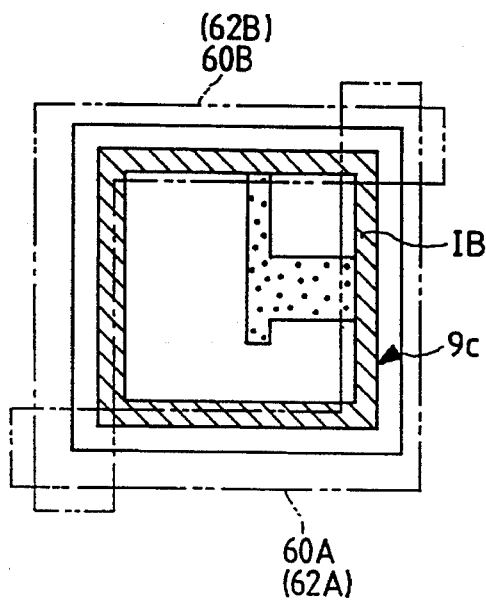
Figure 8D:
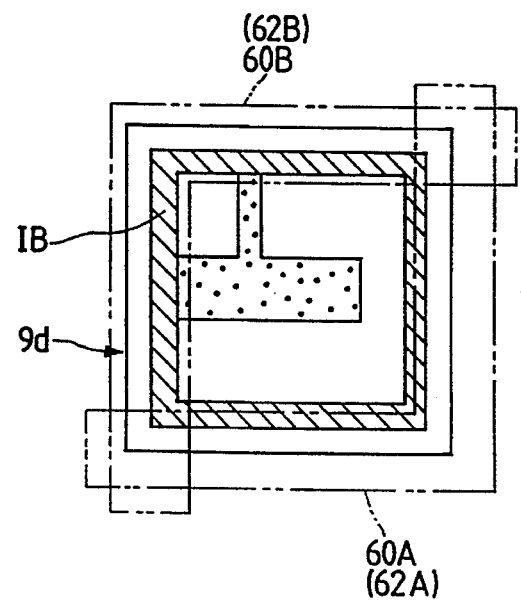

For exposing the upper right exposure area Rb, the blades 60A, 60B are so positioned, as shown in FIG. 8B, that the light attenuating areas thereof protrude from the light shield zone IB, at the left and lower sides of the reticle 9b. For exposing the lower left exposure area Rc, the blades 60A, 60B are so positioned, as shown in FIG. 8C, that the light attenuating areas thereof protrude from the light shield zone IB, at the right and upper sides of the reticle 9c. Also for exposing the lower right exposure area Rd, the blades 60A, 60B are so positioned, as shown in FIG. 8D, that the light attenuating areas thereof protrude from the light shield zone IB at the left and upper side of the reticle 9d.

Through these operations, in the overlapping portions of the exposure areas Ra–Rd, the light attenuating area of the preceding exposure overlaps with that of the succeeding exposure as shown in FIG. 6B, and the synthesized exposure in such overlapping portions becomes equal to the exposure in other areas as shown in FIG. 6D. Consequently the pattern Pr receives uniform exposure, and the line width does not vary even at the junctions of the pattern Pr.

At the same time there is also eliminated the step difference at the pattern junction, as will be explained in the following with reference to FIGS. 9A to 9E.

FIG. 9A shows the image area synthesis or composition by the conventional method, in which a positional aberration δ between the adjacent exposure areas results in a step difference of a same amount at the junction of patterns Pr1, Pr2. On the other hand, in the present embodiment, even in case of a positional aberration δ between the adjacent exposure areas as shown in FIG. 9B, the patterns Pr1, Pr2 are smoothly connected as indicated by thicker lines therein.

As the junction portions of the patterns Pr1, Pr2 coincide with the light attenuating portions (of the width W) of the exposure areas, said junction portions receive gradually decreasing exposure toward the respective edges thereof, as indicated in FIG. 9C at cross sectional positions d1–d5. It is to be noted that the curves, indicating the exposure distribution of the patterns Pr1, Pr2 at the cross sections d1–d5, are mutually aberrated laterally in FIG. 9C, corresponding to the aberration δ of the exposure areas.

Since the synthesized or composite exposure is constant in positions where the patterns Pr1, Pr2 completely overlap, the synthesized or composite exposures at the cross-sectional positions d1–d5 shown in FIG. 9B assume the forms as shown in FIG. 9D, and the maximum values of the synthesized exposure at said cross-sectional positions d1–d5 are mutually equal. In consideration of the above-mentioned distribution of exposure, if the property of photoresist is so selected that a portion thereof receiving at least a certain exposure Qc (50% of the maximum exposure in the illustrated case) remains on the photosensitive substrate 11 after the photoresist development, the pattern width at the cross-sectional positions d1–d5 becomes constant as shown in FIG. 9E so that the patterns Pr1, Pr2 are smoothly connected with a constant width as indicated by thicker lines in FIG. 9B.

Even when the image area synthesis or composition is repeated in plural layers, such smooth connection of the junction of the patterns Pr1, Pr2 suppresses the discontinuous variation in the alignment error in the junction of each layer. Consequently, in case of the liquid crystal device, the discontinuous variation in the image contrast at the junctions in the image field is eliminated and the quality of the displayed image is improved.

The variation at the junction of patterns becomes smaller, as will be apparent from FIG. 9B, as the width W of the overlapping portion of the patterns is selected larger. However, an excessively large width W increases the number of synthesis of the image areas, leading to a lowered efficiency, so said width W should be selected, in case of the liquid crystal display device, at a value where the level of the aforementioned variation is not perceptible to the human eyes, generally in a range of 5 to 10 mm. This width W is determined by the protruding amount $L_1$ of the ND filters 601A, 601B shown in FIG. 5 and the projecting magnifications of the lens system 8 and of the projection lens 10.

As explained in the foregoing, the exposure apparatus of the present embodiment, being provided with an imaging lens system 8 between the ND filters 601A, 601B having light attenuating property and the photosensitive substrate 11, is capable of obtaining ideal light attenuation characteristics on the photosensitive substrate 11 by forming the image of the ND filters 601A, 601B on said photosensitive substrate 11, thereby precisely controlling the amount of exposure at the junction of patterns and fully exploiting the effect by such light attenuation. Also as the ND filters 601A, 601B are separated from the reticle 9, owing to the presence of the lens system 8, the reticle 9 no longer needs to have the light attenuating property and is freed from the danger of damage or contamination. Also as the light attenuating position on the reticle 9 can be regulated by the driving mechanisms 61A, 61B, the light attenuating area can be modified according to the size of the reticle 9 or the variation in the exposure area.

Figure 10:
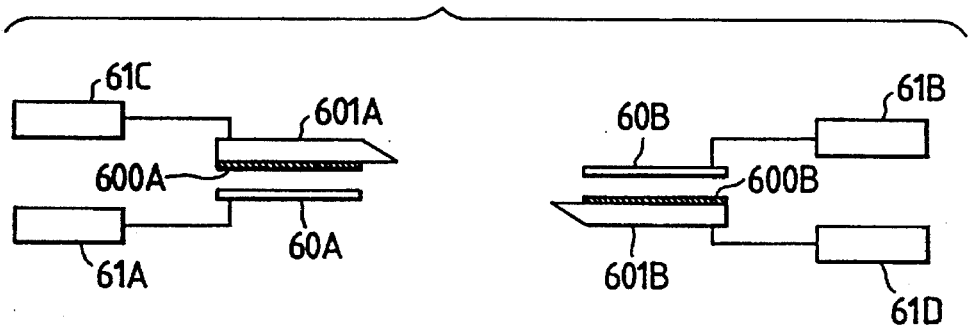
FIG. 10 is a view showing examples in which an ND filter is positioned separate from the blade member for illumination area setting.

In the present embodiment, the ND filters 601A, 601B are mounted on the blades 60A, 60B of the reticle blind 6 for regulating the illuminated area of the reticle 9, but it is also possible, as shown in FIG. 10, to separate the ND filters 601A, 601B from the blades 60A, 60B, and to drive the blades 60A, 60B by driving mechanisms 61A, 61B while to drive the ND filters 601A, 601B by driving mechanisms 61C, 61D. In this case, on the sides of the reticle where the light attenuation is not required at the image area synthesis, the ND filters 601A, 601B are retracted from the illumination area defined by the blades 60A, 60B. Such configuration enables effective utilization of the area of the reticle, by forming the light shield zone, to be formed thereon, narrower than the width of the light attenuating areas by the ND filters 601A, 601B. On the other hand, when the ND filters 601A, 601B are mounted on the blades 60A, 60B, the light shield zone on the reticle has to be at least as wide as the ND filters 601A, 601B. The ND filters 601A, 601B, separated from the blades 60A, 60B may further be provided with light shield plates 600A, 600B similar to the blades 60A, 60B.

Figure 11:
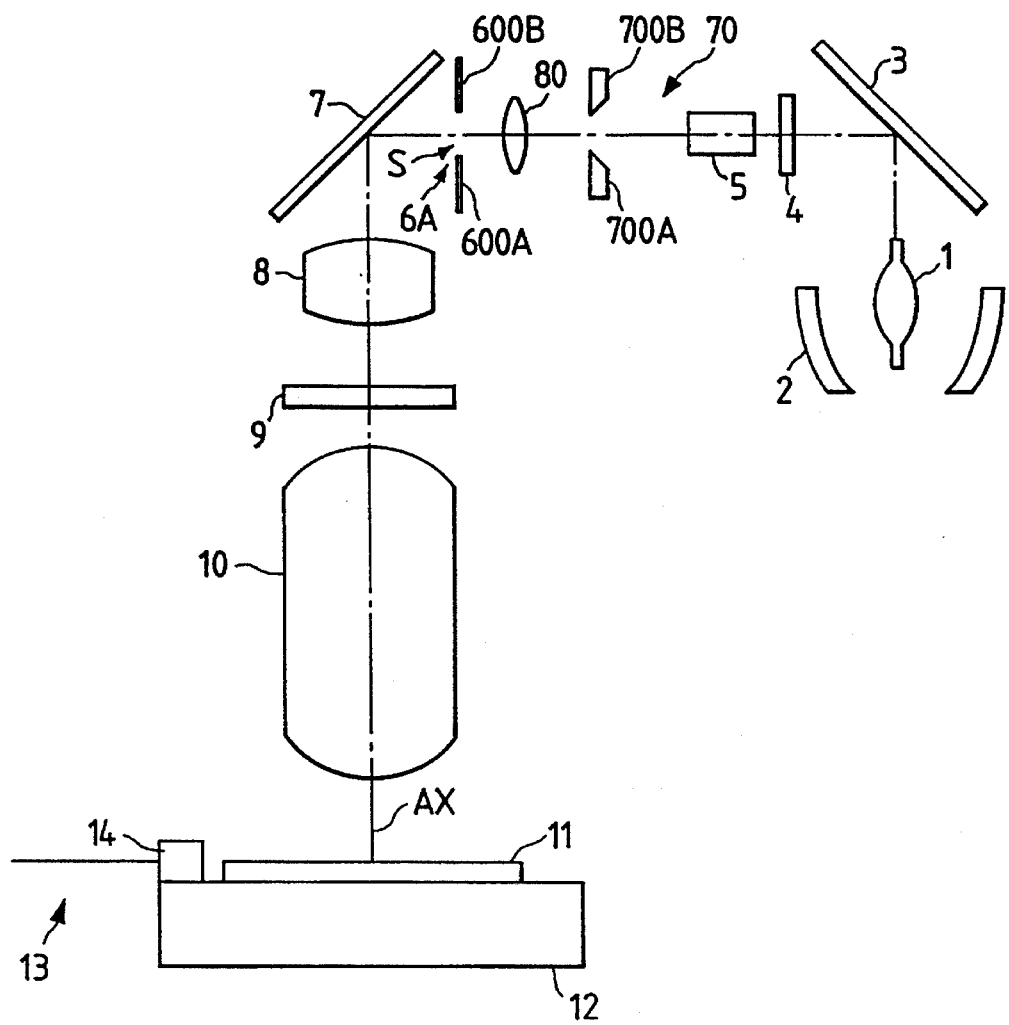
FIG. 11 is a schematic view of the exposure apparatus constituting a variation of the first embodiment.

FIG. 11 shows a variation, in which the ND filters are removed from the light shield plates 600A, 600B of the reticle blind 6A (illumination area setting means), while there are newly provided an ND blind 70 composed of blades 700A, 700B consisting solely of ND filters and unrepresented driving mechanisms for said blades, and a lens system positioned between the ND blind 70 and the reticle blind 6A and adapted to form the image of the ND blind 70 onto the reticle blind 6A. The details of the blades 700A, 700B will not be explained as they are similar to the ND filters 601A, 601B shown in FIG. 1. Since the ND blind 70 is optically conjugate with the reticle blind 6A in this embodiment, the ideal light attenuation characteristics can be obtained on the reticle 9, despite that the light attenuating means is separated from the reticle blind 6A.

Figure 12:
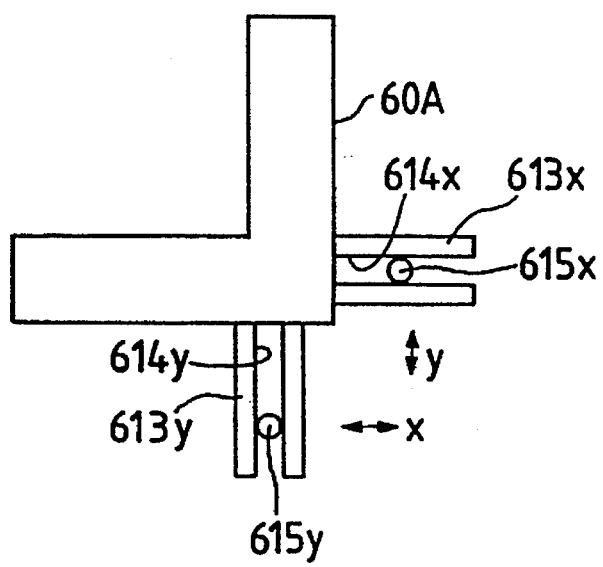
FIG. 12 is a view showing a variation of the driving mechanism for the reticle blind.
Figure 13:
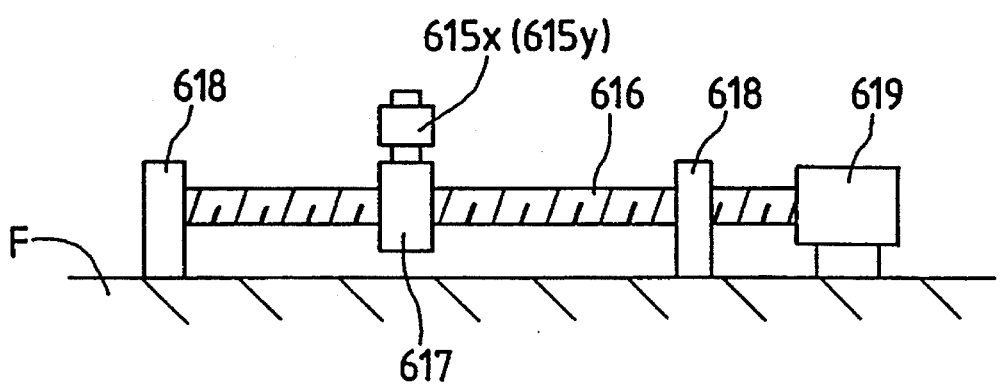
FIG. 13 is a view showing the configuration around the ball screw shown in FIG. 12.

FIGS. 12 and 13 illustrate a variation of the driving mechanism 61A shown in FIG. 2. This driving mechanism is provided with blocks 613x, 613y extending mutually perpendicularly from the corner of the blade 60A, and rollers 615x, 615y fitted in grooves 614x, 614y of the blocks 613x, 613y. As shown in FIG. 13, the roller 615x (or 615y) is rotatably to mounted on a nut 617 engaging with a ball screw 616. There are provided two ball screws respectively in the x- and y-directions in FIG. 12, linked respectively with the rollers 615y and 615x. The ball screw 616 is supported by bearings 618 on the main body F of the exposure apparatus and is rotated by a servo motor 619, whereby the nut 617 is axially moved to displace the roller 615x or 615y in a direction perpendicular to the groove 614x or 614y, thereby moving the blade 60A in a plane perpendicular to the optical path.

The ND filter to be employed in this invention can be composed of chromium deposited on a transparent glass substrate so as to attenuate the transmittance to the illuminating light. In said filter, the chromium film is deposited in dots smaller than the resolution limit of the exposure apparatus and in such a manner that the density of the dots becomes larger as the distance from the optical axis of the exposure apparatus increases. The ND filter composed of such dot-shaped chromium film is preferably so positioned that the plane of the deposited chromium is aberrated from the position conjugate with the reticle 9. The amount of the aberration is so determined that the photosensitive substrate is not affected by a contaminant matter of a predetermined size or larger, eventually present on the above-mentioned ND filter utilizing the chromium film.

The light attenuating means is not limited to an optical filter, but can also be any other element capable of reducing the amount of light, such as a liquid crystal element or an electrochromic element. The light attenuation characteristics of the ND filter are not limited to those of linear light attenuation as a function of the distance from the center of the aperture S, but can also be non-linear as long as the synthesized exposure in the overlapping portion of the exposure areas substantially coincides with the exposure in other areas. The light attenuation is also possible by blurring the image of the edge of aperture of the reticle blind, by displacing the focal position of the lens. It is furthermore possible to attain light attenuation by providing, in addition to the conventional reticle blind, a second reticle blind in another axial position and forming, on the reticle, a blurred image of the aperture of said second reticle blind.

Figure 14:
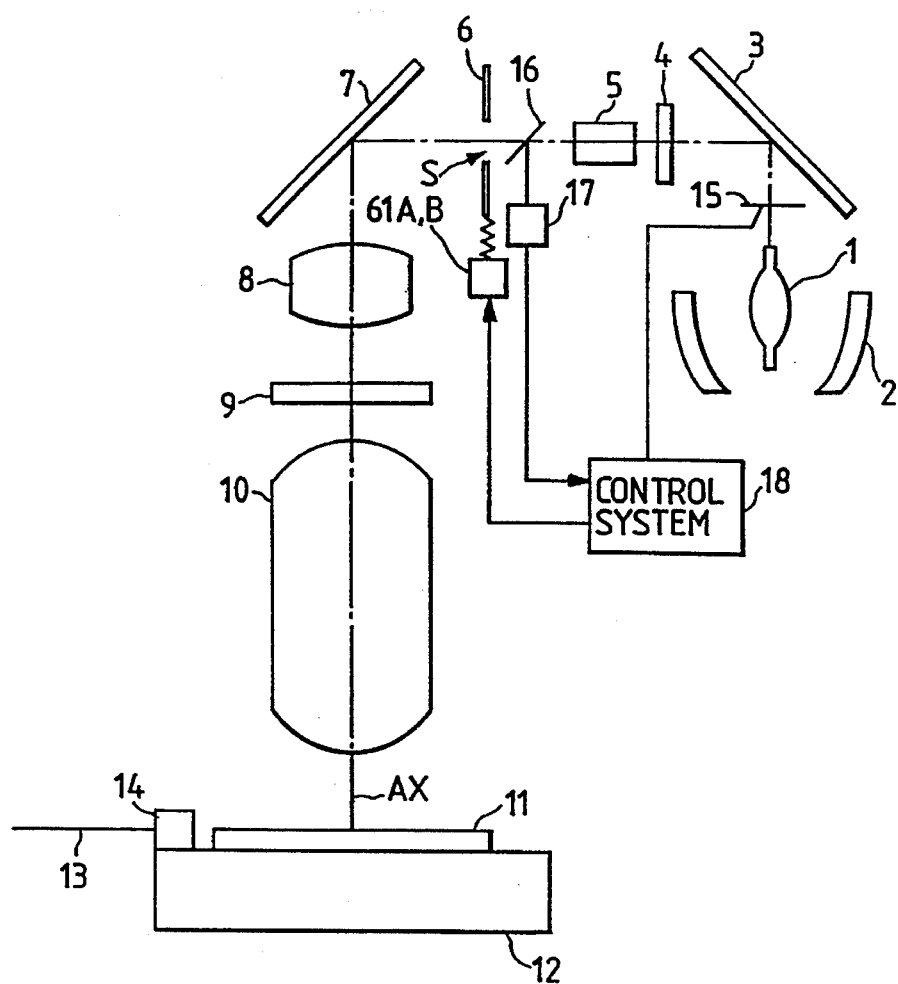
FIG. 14 is a schematic view of an exposure apparatus constituting a second embodiment of the present invention.

FIG. 14 is a schematic view of an exposure apparatus constituting a second embodiment of the present invention, wherein the illuminating light from an ultra high pressure mercury lamp 1, constituting the exposure light source, is condensed by an elliptical mirror 2, then guided through a shutter 15 (exposure means) and a mirror 3 and enters a wavelength selecting filter 4, which only transmits the light of a wavelength required for exposure (usually that of g- or i-line). The illuminating light transmitted by the wavelength selecting filter 4 is converted into a light beam of uniform intensity by a fly's eye integrator 5 and reaches a reticle blind 6 which regulates the illumination area of the illuminating light on the reticle, by varying the size of an aperture S. A part of the light beam emerging from the fly's eye integrator 5 is reflected by a half mirror 16 and enters a cumulative exposure meter (cumulative exposure detecting means) 17, of which information is used for controlling the opening period of the shutter 15. The above-mentioned cumulative exposure meter 17 detects the cumulative exposure from the opening of the shutter 15 to the current time, thereby controlling the amount of exposure.

The illuminating light transmitted by the aperture S of the reticle blind 6 is reflected by a mirror 7 and enters a lens system 8, which forms an image of the aperture S of the reticle blind 6 on the reticle 9, thereby illuminating a desired area of the reticle 9. An image of a pattern, present in the illuminated area of the reticle 9, is formed by a projection lens 10 on a photosensitive substrate 11 such as a wafer or a glass plate, whereby a specified area of the photosensitive substrate 11 is exposed to the image of the pattern of the reticle 9.

The photosensitive substrate 11 is fixed on a stage 12, which is of a known structure composed of a pair of blocks respectively movable in mutually orthogonal directions. The position of the stage 12 is detected, based on a laser beam 13 emitted from an unrepresented laser interferometer and reflected by a movable mirror 14 provided on the stage 12, and the position of the photosensitive substrate 11 in the horizontal plane is thus adjusted. In case of the image area synthesis, after an exposure, the reticle 9 is replaced by another and the stage 12 is so driven as to align another exposure area of the photosensitive substrate 11 to the projection optical system, followed by an exposure, and the entire area of the photosensitive substrate 11 is exposed by repeating the above-explained procedure after each exposure. The image area synthesis may also be attained by forming plural patterns on a reticle and suitably varying the illuminated area within the reticle (thereby selecting a different pattern) in linkage with the alteration of the exposure area on the photosensitive substrate 11.

Figure 15:
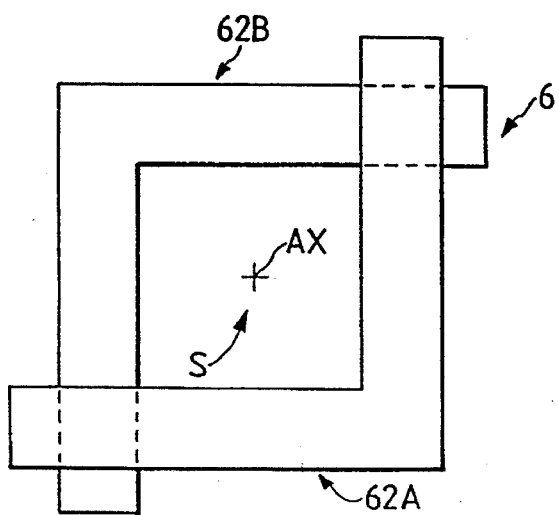
FIG. 15 is a plan view of blades of the reticle blind in the second embodiment.

The reticle blind 6 is similar, in structure, to that in the first embodiment, and is driven by similar driving mechanisms, but is different in that the blades defining the aperture S have a transmittance of 0% at the edge. More specifically, a rectangular aperture S is defined, as shown in FIG. 15, by L-shaped blades 62A, 62B mutually combined along a plane perpendicular to the optical axis AX of the illuminating light, and the size of the aperture S is varied by regulating the positions of the blades 62A, 62B with driving mechanisms 61A, 61B shown in FIG. 14.

The above-mentioned shutter 15, cumulative exposure meter 17 and driving mechanisms 61A, 61B are all controlled by a control system 18 (the driving mechanisms and the control system constituting movement control means). After the reticle blind 6 is set at a pattern area, to be exposed, of the reticle 9, the shutter 15 is opened under an instruction from the control system 18 to initiate the exposure to the photosensitive substrate 11. In synchronization with the function of the shutter 15, the reticle blind 6 starts movement, and the cumulative exposure meter 17 measures the cumulative amount of exposure. When the signal from the cumulative exposure meter 17 reaches a predetermined exposure amount, the shutter 15 is closed and the reticle blind 6 terminates the movement. The moving speed of the reticle blind 6 is so selected that the reticle blind moves over a distance corresponding to the area of desired image area synthesis, during the open period of the shutter 15.

More specifically, in case of exposing two pattern areas A, B shown in FIGS. 16A and 16B with mutual overlapping of the dotted portions, the reticle blind 6 is at first set corresponding to the white portion of the pattern area A, as shown in FIG. 16C. Then, as shown in FIG. 16D, the blades 62A, 62B of the reticle blind 6 (blade 62A alone in the illustrated example) are so moved as to gradually expand the aperture S during the exposure, whereby the exposure amount in an area A1–A2 on the photosensitive substrate 11, corresponding to the expanded portion (dotted portion in FIG. 16D) of the aperture S decreases with a predetermined rate toward the end of the expanding direction of the aperture S. In the example illustrated in FIGS. 16A to 16E, the blade 62A alone is driven in one direction to cause reduction in exposure on only one side of the exposure area on the photosensitive substrate 11, but it is also possible to drive the blade 62A simultaneously in two directions to cause such reduction in exposure on two sides of the exposure area, or to drive the blades 62A and 62B simultaneously in two direction to cause such reduction in exposure on all the sides of the exposure area. Furthermore such reduction in exposure can be attained also by gradually reducing the aperture S in the course of the exposure.

In such exposure apparatus, the time of exposure is generally determined for example by the sensitivity of the photosensitive material. Therefore, in the exploitation of the present invention, the moving speed of the reticle blind has to be adjusted according to the exposure time. Also the light source is generally composed of an ultra high pressure mercury lamp, of which illumination intensity is known to decrease with the time of use. Consequently, even for a constant amount of exposure, the exposure time becomes longer as the lamp is used for a longer time. The exposure time T (sec) is given by the following formula, as a function of the exposure amount D (mJ/cm$^2$) and the illumination intensity I (mW/cm) at exposure:

$$T = D/I \qquad (1)$$

In this equation (1), the exposure amount D can be given in advance, but the illumination intensity I is variable. As the reticle blind has to move, during the exposure time T, a distance $L_2$ corresponding to the overlapping width W (mm) between the exposure areas ($L_2 = W/M_1 \cdot M_2$ wherein $M_1$ is the magnification of the reticle blind by the lens system 8 to the reticle, and $M_2$ is the magnification of the reticle by the projection lens 10 to the photosensitive substrate), the moving speed V (mm/sec) of the reticle blind is given by the following equation (2):

$$\begin{aligned} V &= L_2/T \qquad (2) \\ &= L_2 I/D \end{aligned}$$

The width W is already determined at the designing of the reticle, and can therefore be given in advance. Consequently the moving speed of the reticle blind can be calculated if the exposing illumination intensity I is known. In the exposure apparatus shown in FIG. 14, the illumination intensity I can be obtained from the output of the cumulative exposure meter 17. More specifically, prior to the exposure operation, the shutter 15 is opened, and the output of the cumulative exposure meter 17 is memorized when it becomes stabilized. The memorized value, multiplied by a certain coefficient, corresponds to the exposing illumination intensity I. The above-explained operation is executed at the replacement of the photosensitive substrate, or at the start of a lot consisting of plural photosensitive substrates. The moving speed of the reticle blind is determined from the equation (2), based on thus obtained illumination intensity I and is memorized in the control system 18.

Figure 17A:
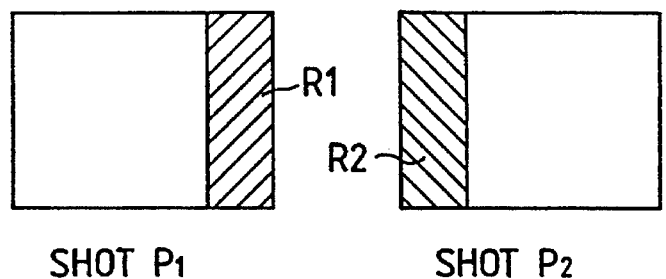
FIGS. 17A to 17D are views showing exposed images on the photosensitive substrate and the amounts of exposure thereof.
Figure 17B:
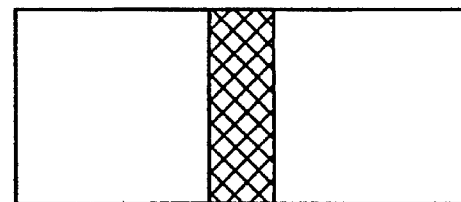
Figure 17C:
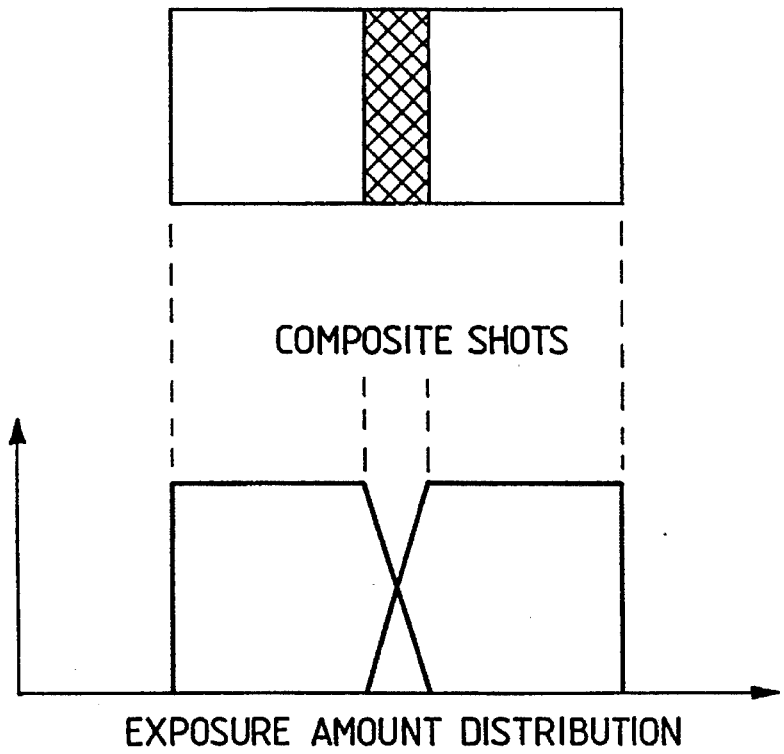
Figure 17D:
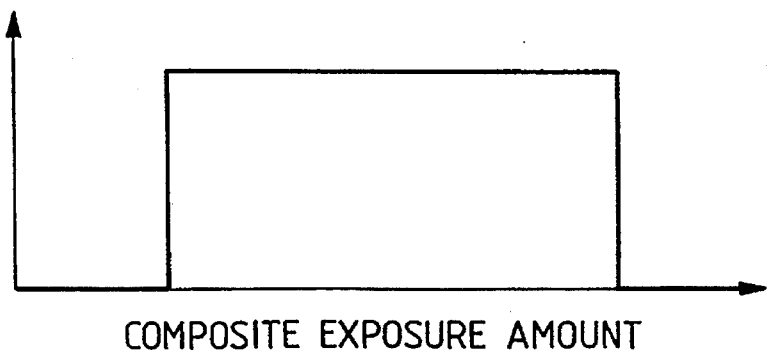

FIGS. 17A to 17D show the exposed images and the exposure distribution on the photosensitive substrate 11 when exposures are made with a suitable size of the aperture S of the reticle blind 6 and without the reticle 9. As shown in FIG. 17A, shots P1, P2 are respectively associated with light attenuation areas indicated by hatched areas R1, R2, in which the amount of exposure are gradually reduced by the movement of the reticle blind. When both shots are synthesized as shown in FIG. 17B, there are obtained respective distributions of the amounts of exposure as shown in FIG. 17C, and, in the overlapping portion of the light attenuation areas R1, R2, the amount of exposure of one of the areas compensates the variation in the amount of exposure in the other. Consequently, as shown in FIG. 17D, the synthesized or composite amount of exposure in the overlapping portion of the light attenuation areas R1, R2 becomes equal to the amount of exposure in the white areas shown in FIG. 17A which are not affected by the movement of the reticle blind.

In the following there will be explained the procedure of image area synthesis with the exposure apparatus of the present embodiment.

As in the example shown in FIG. 7, there will be considered a case of synthesizing a pattern Pr by dividing the photosensitive substrate 11 into four rectangular exposure areas Ra–Rd.

Though not illustrated in FIG. 7, the exposure areas Ra–Rd are made to mutually overlap at the boundaries thereof by a desired amount (corresponding to $L_2$ or W mentioned before), and the blades 62A, 62B of the reticle blind 6 are so positioned at each exposure that the light attenuation area obtained by the movement of the reticle blind coincides with the overlapping portions of the exposure areas Ra–Rd.

More specifically, for exposing the upper left exposure area Ra shown in FIG. 7, the blade 62A, positioned corresponding to the right and lower sides of the reticle 9a, is so positioned that the light attenuation area of the blade 62A protrudes from the light shield zone IB, while the blade 62B, positioned corresponding to the left and upper sides of the reticle 9a, is so positioned as to be completely retracted in the light shield zone IB, as shown in FIG. 8A.

For exposing the upper right exposure area Rb, the blades 62A, 62B are so positioned that the light attenuation areas thereof protrude at the left and lower sides of the reticle 9b from the light shield zone IB, as shown in FIG. 8B. For exposing the lower left exposure area Rc, the blades 62A, 62B are so positioned that the light attenuation areas thereof protrude from the light shield zone IB at the right and upper sides of the reticle 9c, as shown in FIG. 8C. Also for exposing the lower right exposure area Rd, the blades 62A, 62B are so positioned that the light attenuation areas thereof protrude from the light shield zone IB at the left and upper sides of the reticle 9d, as shown in FIG. 8D.

Through these operations, in the overlapping portions of the exposure areas Ra–Rd (namely in the one-dimensionally overlapping portions, excluding a portion where four pattern areas mutually overlap), the light attenuation area of the preceding exposure overlaps with that of the succeeding exposure as shown in FIG. 17B, and the synthesized amount of exposure in such overlapping portions becomes equal to the amount of exposure in other areas as shown in FIG. 17D. Consequently the pattern Pr receives uniform exposure, and the line width does not vary even at the junctions of the pattern Pr.

At the same time there is also eliminated the step difference at the pattern junction, as already explained in relation to FIGS. 9A to 9E.

As explained in the foregoing, the exposure apparatus of the present embodiment, being provided with a control system 18 for moving the reticle blind 6 within the overlapping range of the images of the reticle 9 in the course of exposure to the photosensitive substrate 11, is capable of obtaining ideal light attenuation characteristics in the peripheral areas R1, R2 of the image on the photosensitive substrate, thereby precisely controlling the amount of exposure at the junction of patterns and fully exploiting the benefit of such light attenuation.

In the following there will be explained a variation in the control on the reticle blind movement, with reference to FIGS. 18A and 18B, which respectively show the output of the cumulative exposure meter 17 shown in FIG. 14, corresponding to a single shutter opening operation, and the variation in the moving speed of the reticle blind as a function of time. Thus, in this variation, the voltage obtained by multiplying the output of the cumulative exposure meter with a suitable coefficient is directly used as the speed instructing voltage for the movement of the reticle blind. In this case, the output of the cumulative exposure meter need not be measured in advance, because the speed of the reticle blind becomes automatically lower, following the eventual decrease in illumination intensity of the light source. Also the movement of the reticle blind can be completely synchronized with the open/closing operations of the shutter, as the output of the cumulative exposure meter responds to the opening and closing of the shutter. Consequently the calculation according to the aforementioned equation (2) can be dispensed with. The suitable coefficient mentioned above is to cause the reticle blind to travel over the distance $L_2$, when it is moved according to the wave form indicating the variation in the moving speed, as shown in FIG. 18B. This coefficient is also inversely proportional to the exposure amount D. The control system for the embodiment shown in FIGS. 18A and 18B is illustrated, as a block diagram, in FIG. 19.

The output of the cumulative exposure meter 17 is amplified by an amplifier 21, and is supplied to an integrating circuit 22 and a multiplier 25. On the other hand, the above-mentioned coefficient is released from an output port of a microprocessor 23, and is supplied, through a D/A converter 24, to the other input terminal of the multiplier 25, of which output is supplied to a servo circuit 26 for driving a motor 27 for moving the reticle blind.

In the above-explained second embodiment, the movement of the reticle blind is controlled according to the output of the cumulative exposure meter, but, if the variation in the intensity of the light source is negligibly small, the movement of the reticle blind may be simply controlled in synchronization with the opening and closing of the shutter.

In the second embodiment explained above, the blades 62A, 62B of the reticle blind 6 for defining the illumination area on the reticle 9 are moved in the course of exposure, and such method is perfectly acceptable in the image area synthesis in one-dimensional direction. However, in case of two-dimensional image area synthesis as shown in FIG. 7, there is formed, in the exposure area of the photosensitive substrate, a portion where four pattern areas mutually overlap, and the amount of exposure in such overlapping portion becomes larger than in the remaining area. The countermeasure for such phenomenon will be explained in the following.

Figure 20:
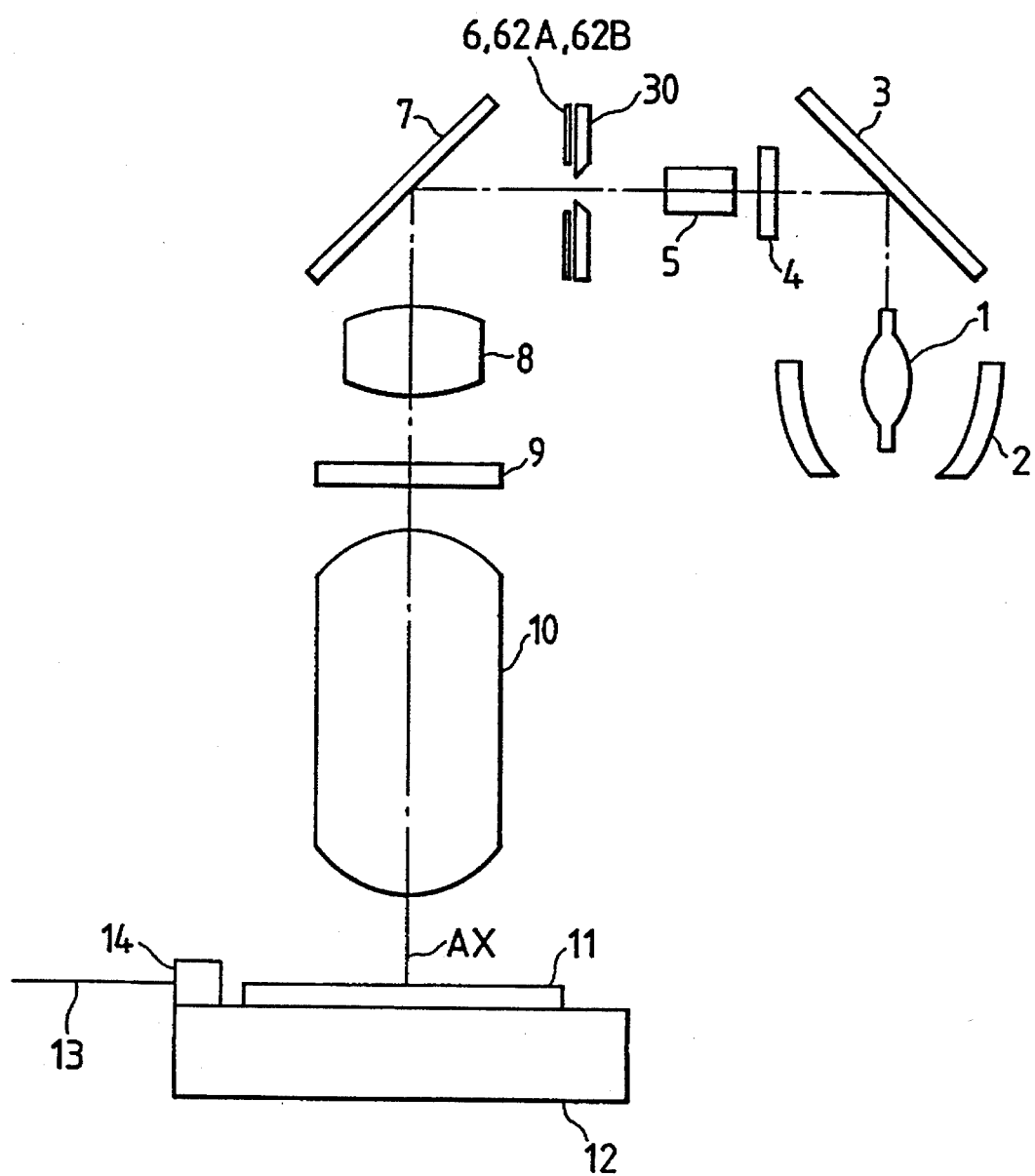
FIG. 20 is a schematic view of an exposure apparatus constituting a third embodiment of the present invention.
Figure 22:
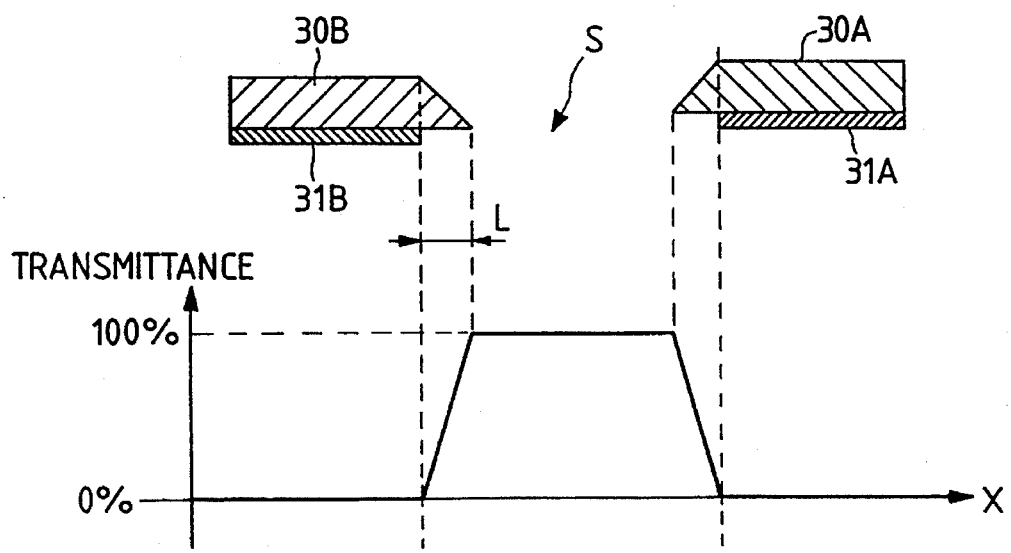
FIG. 22 is a view showing an example of the reticle blind in the exposure apparatus of the third embodiment.

FIG. 20 is a schematic view of an exposure apparatus constituting a third embodiment of the present invention. It is same in the base structure as the apparatus shown in FIG. 14, but is different in that, among four edges of the blades of the reticle blind 6, at least two in the mutually opposed relationship are provided with an ND blind 30 composed of ND filters 30A, 30b having gradually varying transmittance in the edge portion as shown in FIG. 22. In this embodiment, among the plural blades corresponding to the area for effecting the image area synthesis, a part effects the movement of the reticle blind as in the preceding embodiment, while the remaining part forms the light attenuation area in the overlapping portions by the ND filters. More specifically, in case of the image area synthesis as shown in FIG. 7, the light attenuation areas for the overlapping for example between the exposure areas Ra and Rb or between Rc and Rd are formed by the reticle blind movement explained above, while those for the overlapping between the exposure areas Ra and Rc or between Rb and Rd are formed by the ND blind. In such configuration, in the overlapping portion where four pattern areas mutually overlap, the amount of exposure per pattern area decreases and the synthesized amount of exposure in said overlapping portion becomes comparable to that in the remaining area. Consequently satisfactory image area synthesis can be achieved also in two-dimensional manner.

In this embodiment, with respect to the blades not requiring light attenuation at the image area synthesis, the ND filter 30A and/or 30B is retracted from the illumination area defined by the blades 62A, 62B. This configuration allows effective utilization of the area of the reticle, as the light shield zone to be formed thereon can be made narrower than the light attenuation areas obtained by the ND filters 30A, 30B. In case the ND filters 30A, 30B are integrally formed with the blades 62A, 62B, the light shield zone on the reticle has to be at least as wide as the light attenuation areas of the ND filters 30A, 30B. The ND filters 30A, 30B, formed separate from the blades 62A, 62B, may be provided with light shield plates 31A, 31B similar to the blades 62A, 62B.

Figure 21:
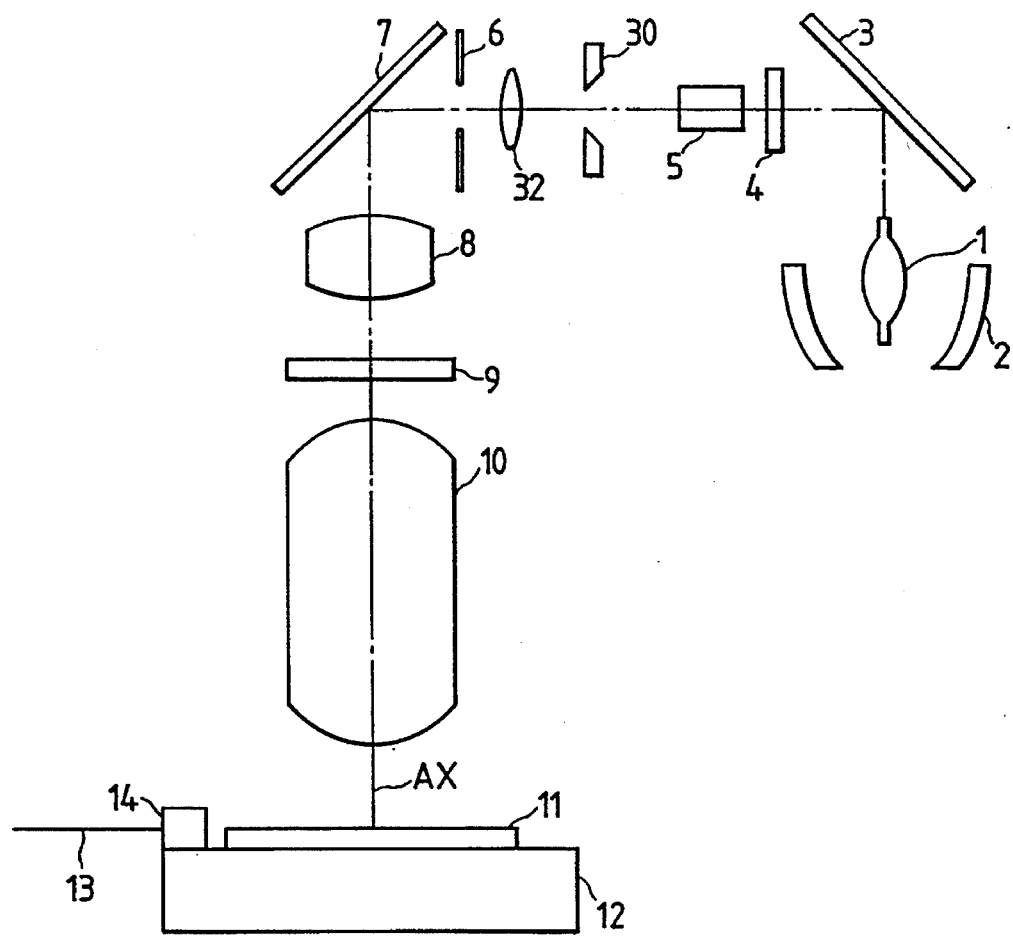
FIG. 21 is a view showing a variation of the embodiment shown in FIG. 19.

In the above-explained embodiment, the ND blind is positioned in the vicinity of the reticle blind, but it is also possible, as shown in FIG. 21, to provide an optical system 32 thereby maintaining the reticle blind 6 and the ND blind 30 in mutually conjugate relationship. The ND blind 30 in this case is to be provided with blades 30A, 30B consisting solely of ND filters, and unrepresented driving mechanisms for driving the blades 30A, 30B. Such configuration makes it possible to obtain ideal light attenuation characteristics on the reticle 9, as the ND blind 30 is in conjugate relationship to the reticle blind 6.

The ND blind to be employed in the two-dimensional image area synthesis need not necessarily be composed of the ordinary optical light attenuating filters, but, as in the first embodiment, may also be composed, for example, of other means such as liquid crystal elements or electrochromic elements.

Also the light attenuating characteristic achieved by the reticle blind movement or by the ND blind need not be limited to the linear reduction of the transmitted light as a function of the distance from the center (optical axis AX) of the aperture S, but may also include non-linear variation in the amount of transmitted light, as long as the synthesized amount of exposure in the overlapping portion of the exposure areas substantially coincides with the amount of exposure in other areas. The light attenuation can also be achieved by blurring the image of the edge of aperture of the reticle blind, by defocusing the lens. More specifically, the light attenuation can also be achieved by providing, in addition to the conventional reticle blind, a second reticle blind in an axially different position, thereby forming, on the reticle, a blurred image of the aperture of said second reticle blind.

Figure 23:
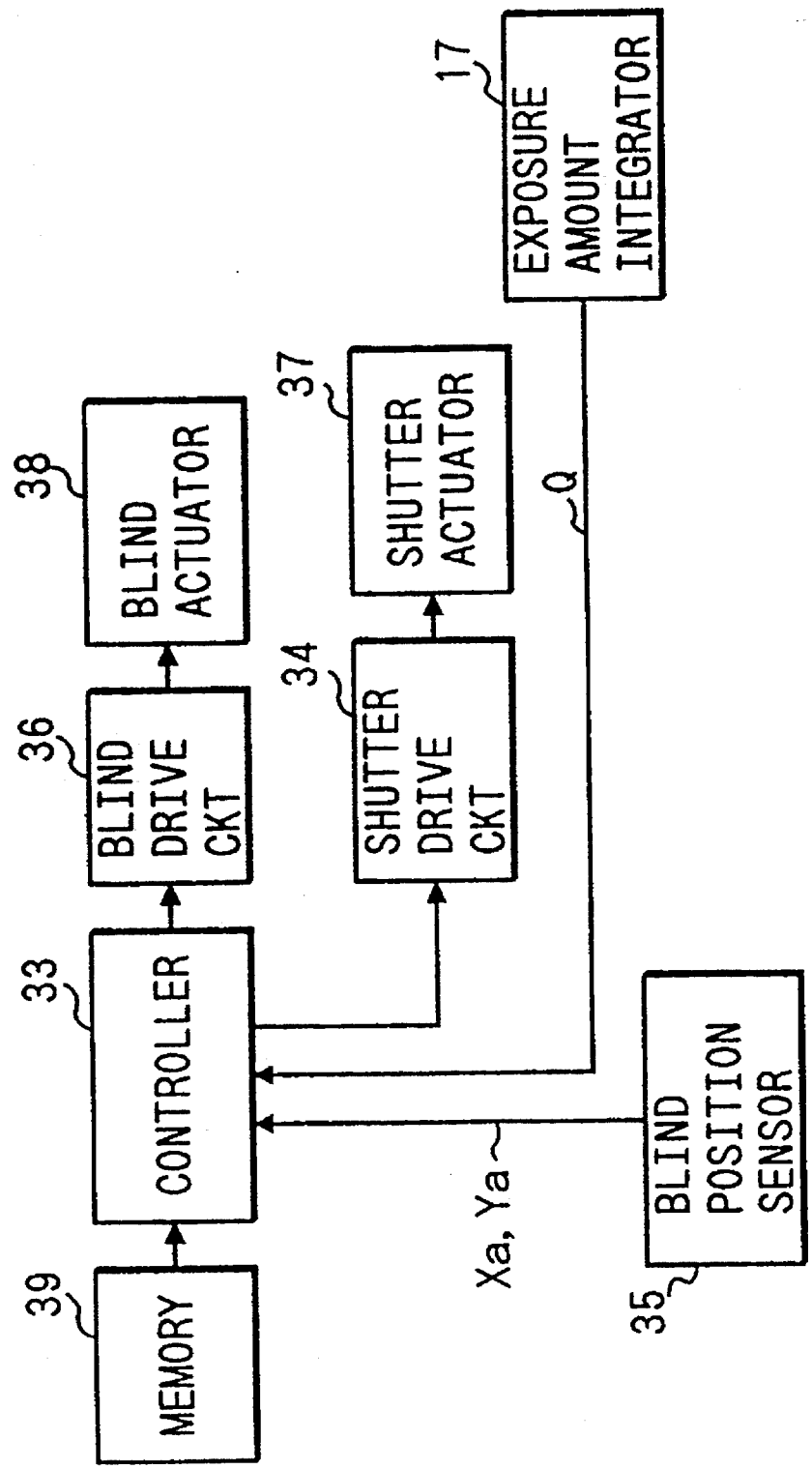
FIG. 23 is a block diagram of a drive control system for the shutter and the blind in a fourth embodiment.
Figure 24:
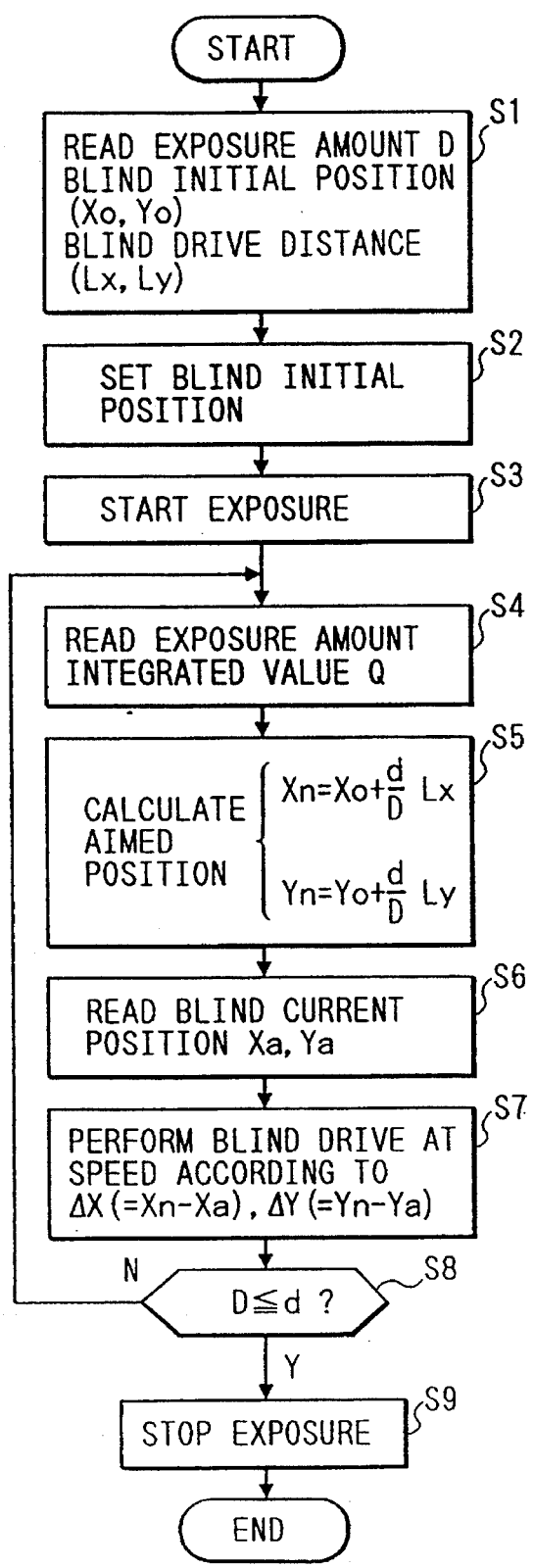
FIG. 24 is a flow chart showing the control sequence for the shutter and the blind during an exposure in the fourth embodiment.

Another example of the control system 18 for the above-explained second (or third) embodiment is shown, as a fourth embodiment, in FIG. 23, and FIG. 24 shows a flow chart of the control sequence of the above-mentioned control system.

As shown in FIG. 23, the control system for achieving the above-explained function of the reticle blind 6 is provided with a controller 33 composed of a microcomputer and peripheral devices thereof. The controller 33 provides a shutter driver circuit 34 with a shutter driving signal according to the cumulative exposure Q detected by a cumulative exposure meter 17, and also provides a blind driver circuit 36 with a blind driving signal, based on the cumulative exposure Q and the current position Xa, Ya of the blades 62A, 62B of the reticle blind 6 in the X and Y directions, detected by a blind position sensor 35. The shutter driver circuit 34 drives an actuator 37 for opening and closing the shutter 15, in response to the above-mentioned shutter driving signal. Also the blind driver circuit 36 drives a blind actuator (a servo motor in this embodiment) 38 for driving the reticle blind 6, with a speed corresponding to the blind driving signal from the controller 33.

The cumulative exposure meter 17 can be so constructed as to convert the output of an integrating sensor, releasing a voltage corresponding to the intensity of the illuminating light, by V/F convertion into a pulse train of a frequency corresponding to said voltage and cumulatively counting the number of the pulses by a counter, but it may also be so constructed as to fetch the output signal of the integrating sensor into the controller 33 after A/D conversion and to cumulatively count the pulses by the software. Also the blind position sensor 35 can be so constructed as to effect V/F conversion on the output signal of a potentiometer, releasing a voltage corresponding to the position of the reticle blind 6, into a pulse train of a frequency corresponding to the output voltage and to cumulatively count the number of pulses by a counter, or to fetch the output signal of the potentiometer into the controller 33 after A/D conversion and to cumulatively count the number of pulses by the software.

FIG. 23 illustrates only one set of the blind driver circuit 36 and the blind actuator 38, but, as will be apparent from FIGS. 2 and 3, there are provided, in total, four sets of the blind driver circuit 36 and the blind actuator 38, for independently drive the blades 62A, 62B respectively in the X and Y directions. There is also provided a memory 39 storing, in advance, data for effecting exposure according to the kind of the photosensitive substrate 11. The data stored in the memory 39 include the appropriate exposure D of the photosensitive substrate 11, the initial position $X_0$, $Y_0$ of the blades 62A, 62B of the reticle blind 6 in the X and Y directions at the start of exposure, and the moving distances Lx, Ly of the blades 62A, 62B in the X and Y directions in the course of exposure. The moving distances Lx, Ly can be determined from the following equations (3):

$$Lx = Wx/(M_8 \cdot M_{10})$$

$$Ly = Wy/(M_8 \cdot M_{10}) \qquad (3)$$

wherein Wx and Wy are overlapping widths in directions corresponding to the X and Y directions of the exposure area on the photosensitive substrate 11, and $M_8$ and $M_{10}$ are magnifications of the lens system 8 and the projection lens 10. The appropriate exposure D, the overlapping widths Wx, Wy and the initial position $X_0$, $Y_0$ are determined at the designing stage of the reticle.

In the following there will be explained the sequence of an exposure operation in the exposure apparatus of the fourth embodiment, with reference to a flow chart shown in FIG. 24.

The controller 33 starts the sequence shown in FIG. 24, when a predetermined exposure area of the photosensitive substrate 11 is positioned, by the function of the stage 12, with respect to the projection lens 10. At first a step S1 reads the appropriate exposure D, the initial position $X_0$, $Y_0$ of the blades 62A, 62B of the reticle blind 6, and the moving distances Lx, Ly of the blades 62A, 62B from the memory 39, and a next step S2 moves the blades 62A, 62B to the initial position $X_0$, $Y_0$. Then a step S3 initiates the exposure by opening the shutter 15. After the start of exposure, a step S4 reads the cumulative exposure Q from the cumulative exposure meter 17, and a step S5 calculates the target position Xn, Yn of the blades 62A, 62B corresponding to the cumulative exposure Q, according to the following equations (4):

$$Xn = X_0 + (Q/D) \cdot Lx$$

$$Yn = Y_0 + (Q/D) \cdot Ly \qquad (4)$$

A next step S6 fetches the current position Xa, Ya of the blades 62A, 62B detected by the blind position sensor 35, and a next step S7 drives the blades 62A, 62B with a speed corresponding to the positional differences ΔX (= Xn–Xa) and ΔY (=Yn–Ya), in order promptly to move the blades to the target position Xn, Yn. Stated differently, the moving speed is made larger as ΔX and ΔY become larger.

Subsequently a step S8 discriminates whether the cumulative exposure Q has reached the appropriate exposure D, and, if not, the sequence returns to the step S4 to repeat the calculation of the target position Xn, Yn corresponding to the cumulative exposure Q and the setting of the driving speed. On the other hand, if the step S8 identifies that the appropriate exposure D has been reached, a step S9 closes the shutter 15 to terminate the exposure, thereby terminating the sequence.

In the present embodiment, since the exposure in the overlapping portion of the exposure areas on the photosensitive substrate 11 is reduced by the movement, in the course of exposure, of the reticle blind 6 for defining the illumination area of the reticle 9, it is not necessary to provide the reticle 9 itself with the light attenuating property, or to employ exclusive light attenuating filters according to the kinds of the reticle 9 or the variation in the overlapping portion of the exposure areas. Since the reticle blind 6 is positioned, for the function thereof, in conjugate relationship with the reticle 9, it is rendered possible to precisely control the illumination area of the reticle 9 by the positions of the blades 62A, 62B and to attenuate the exposure in the overlapping portion of the exposure areas on the photosensitive substrate 11 according to the desired light attenuation characteristics.

Also in the present embodiment, as the target position of the blades 62A, 62B is calculated in successive manner according to the cumulative exposure Q and the driving speed of the reticle blind 6 is regulated according to the difference between the calculated target position and the current position of the blades 62A, 62B, it is rendered possible to precisely control the exposure, overcoming the variation in the illumination intensity on the reticle 9 and the eventual error in the speed of the control system.

More detailedly, in case the exposure is varied by the movement of the blades 62A, 62B as shown in FIG. 16D, the exposure amount can be theoretically varied at a constant rate as shown in FIG. 16E by simply driving the blades 62A, 62B with a constant speed $V=L_2 \cdot I/D$, wherein $L_2$ is the moving distance of the blade, I is the illumination intensity (light amount per unit time) of the exposing light source, and D is the appropriate exposure. In practice, however, such method results in an error in the exposure, since the reticle blind 6 does not respond to the eventual fluctuation in the illumination intensity I during the exposure or the transient variation in the light amount at the opening and/or closing of the shutter 15. In order to resolve such drawback, there can be conceived a method of detecting the intensity of the illuminating light with a sensor during the exposure and to regulate the driving speed of the reticle blind 6 according to the variation in the illumination intensity. However, such method generates an error in the position of the reticle blind 6, because of an error in the speed of the control system, and such error is gradually accumulated and becomes largest at the end of exposure. For this reason, the synthesized amount of exposure at both ends of the overlapping portion of the exposure areas may be significantly aberrated from the amount of exposure in other areas.

On the other hand, in the present embodiment, since the driving speed is regulated according to the difference between the target position of the blades 62A, 62B calculated in succession and the current position, there will not result accumulation of the positional error, and the blades 62A, 62B can even follow the eventual variation in the illumination intensity in the course of exposure, thereby exactly controlling the amount of exposure.

In the exposure apparatus of the present embodiment, if the control system for the reticle blind 6 involves a delay in response, the blades 62A, 62B move with an aberration from the target position, corresponding to such delay in response. Such drawback can be resolved by adding an offset value, corresponding to the delay, to the target position, in determining the driving speed. The interval of clock signals for the controller 33, governing the cycles of calculation of the target position, should be shorter for obtaining a higher precision, and should be at least sufficiently shorter than the time required for opening or closing the shutter 15.

Figure 25:
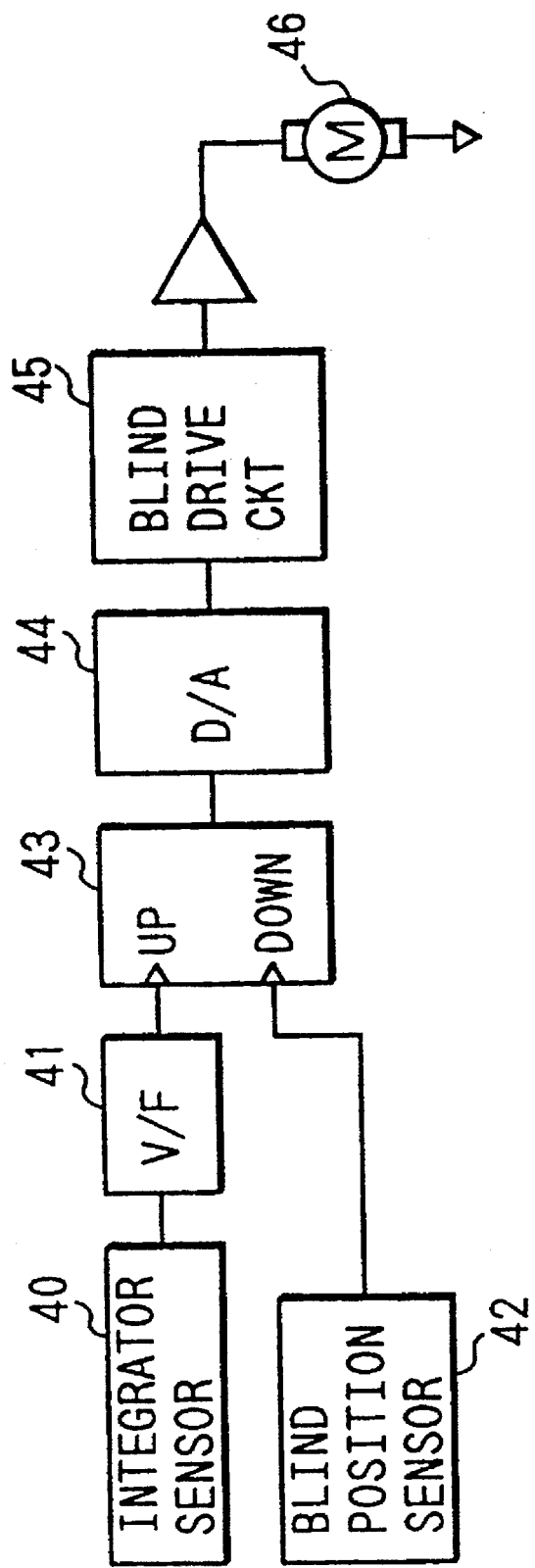
FIG. 25 is a block diagram of a blind driving system in a fifth embodiment.

Now reference is made to FIG. 25 for explaining a fifth embodiment of the present invention, representing a modification in the drive control system for the reticle blind. Since the configuration of the optical systems is the same as that of the second embodiment, the following description will be concentrated on said drive control system.

In the present embodiment, as shown in FIG. 25, a voltage signal corresponding to the intensity of the illuminating light on the reticle is released from an integrating sensor 40 and is converted, by a V/F converter 41, into a pulse train of a frequency corresponding to the voltage. Then the difference in the number of pulses, between thus converted pulse train and a pulse train released from a blind position sensor 42 corresponding to the moving distance of the reticle blind 6, is calculated by an up-down counter 43, and a D/A converter 44 generates an analog voltage, corresponding to the calculated difference in the number of pulses. The output voltage of the D/A converter 44 is supplied to a blind driver circuit 45, which rotates a servo motor 46 for driving the reticle blind, with a speed corresponding to the output voltage mentioned above.

In this embodiment, the cumulative count of the output pulses of the V/F converter 41, corresponding to the appropriate exposure for the photosensitive substrate, is selected the same as the precalculated cumulative count of the output pulses of the blind position sensor 42 corresponding to the moving distance of the reticle blind at the exposure. Consequently the output of the up-down counter 43 corresponds to the aberration between the target position of the reticle blind and the current position thereof, so that the reticle blind is constantly driven with a speed corresponding to the aberration from the target position, and there can be attained highly precise light attenuation characteristics as in the fourth embodiment.

In the following there will be explained a sixth embodiment of the present invention, with reference to FIGS. 26, 27A and 27B.

Figure 26:
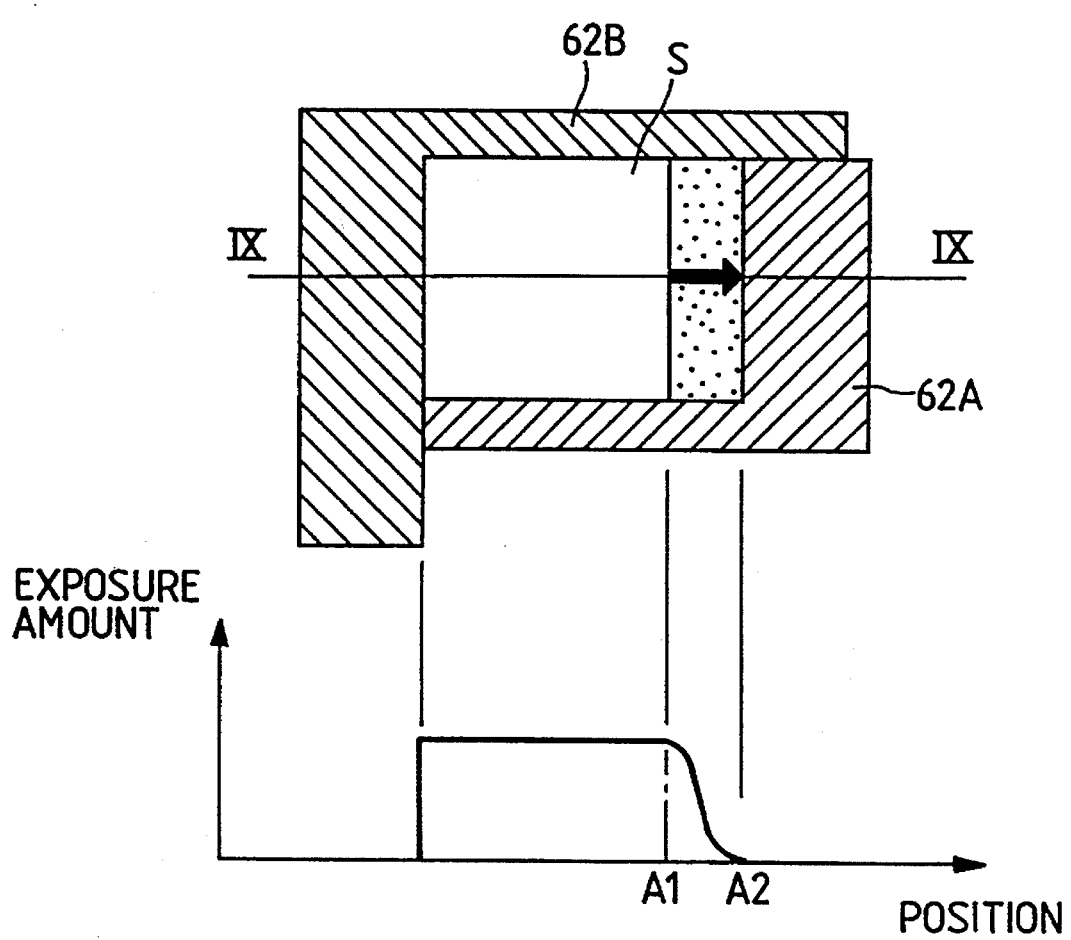
FIG. 26 is a view showing the correspondence between the blind movement during the exposure in a sixth embodiment and the distribution of exposure along a line IX—IX on the photosensitive substrate.

The present embodiment is the same as the fourth embodiment in that the blades 62A, 62B (62A only in the illustrated example) of the reticle blind 6 are so moved as to gradually expand the aperture S in the course of exposure as shown in FIG. 26, but it differs from the fourth embodiment in that the blades 62A, 62B are so controlled that the amount of exposure in the range A1–A2 on the photosensitive substrate 11, corresponding to the expanded portion (dotted area in FIG. 26) of the aperture S, decreases according to a higher-order function, toward the end of the expanding direction of the aperture S. More specifically, in the present embodiment, the equations (4) employed in the step S5 of the flow chart shown in FIG. 24, for determining the target position Xn, Yn, are replaced by the following equations (5):

$$Xn = X_0 + \alpha_x(Q/D) \cdot Lx$$

$$Yn = Y_0 + \alpha_y(Q/D) \cdot Ly \quad (5)$$

wherein $\alpha_x$ and $\alpha_y$ are equations or data tables for obtaining desired variations according to higher-order functions.

Figure 27A:
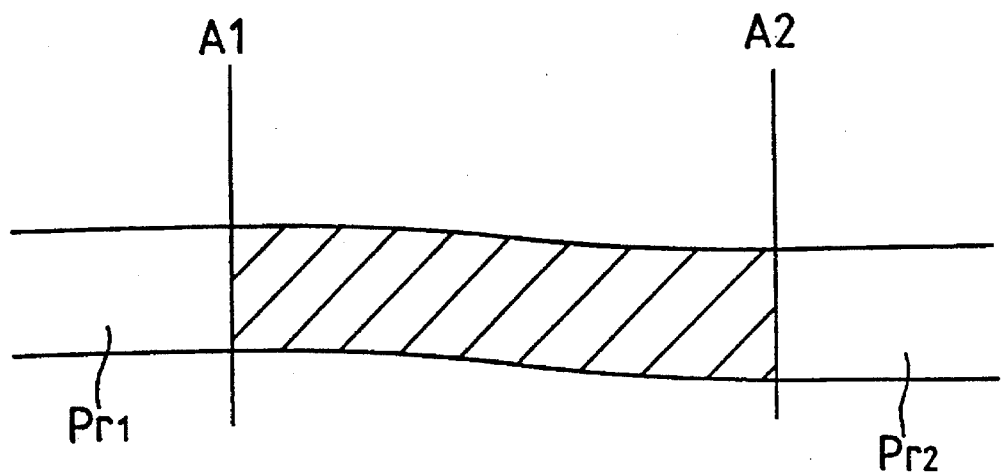
FIGS. 27A and 27B are views showing variation in the pattern junction, in comparison with that in the second embodiment.
Figure 27B:
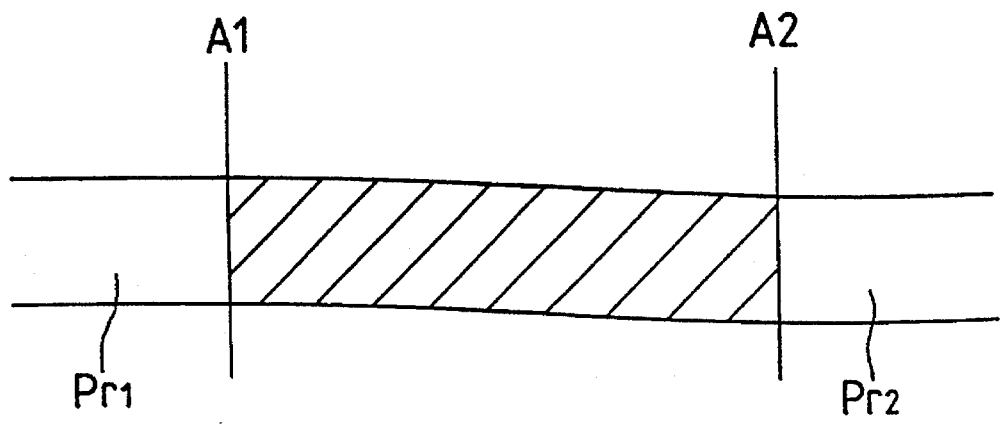

In the present embodiment, when two patterns Pr1, Pr2 to be exposed on the photosensitive substrate are mutually aberrated, within the overlapping portion A1–A2, in a direction along the edges of the exposure areas (vertical direction in FIG. 27A), the patterns Pr1, Pr2 are mutually connected with a pattern variation according to a high-order function in the direction of positional aberration, as indicated by a hatched area in FIG. 27A. On the other hand, with the first-order light attenuating characteristics as in the fourth embodiment, the patterns Pr1, Pr2 are mutually connected with a constant inclination relative to the direction of positional aberration, as illustrated by the hatched area in FIG. 27B. Consequently, in case of forming the pattern of the liquid crystal display device by the image area synthesis, the present embodiment is superior because the pattern junctions are less conspicuous to the human eyes.

What is claimed is:

1. An exposure apparatus comprising:

an illumination optical system for irradiating at least one mask with a light beam from a light source;

a projection optical system for projecting images of patterns on said at least one mask, illuminated by said light beam, onto a photosensitive substrate; and light attenuation means disposed in a position in said illumination optical system that is substantially conjugate with said at least one mask, said attenuation means decreasing an amount of light in a peripheral portion of an image of a pattern projected onto said photosensitive substrate, as the distance from the center of said image increases.

2. An exposure apparatus according to claim 1, further comprising stepping means for steppingly-and-repeatingly causing images of said patterns to be projected on different areas on said photosensitive substrate and causing said images to mutually overlap in peripheral portions thereof, and wherein said light attenuation means has light attenuation characteristics such that an amount of light of said images in said peripheral portions is substantially equal to an amount of light in portions of said images other than said peripheral portions.

3. An exposure apparatus according to claim 2, wherein a first pattern portion corresponding to a peripheral portion of an image is identical with a second pattern portion corresponding to an overlapping peripheral portion of another image.

4. An exposure apparatus according to claim 1, wherein said illumination optical system has an aperture disposed in a position substantially conjugate with said at least one mask and transmitting said light beam, and said light attenuation means comprises a light absorbing member provided at a peripheral portion of said aperture and having transmittance which gradually decreases as the distance from the center of said aperture increases.

5. An exposure apparatus according to claim 1, wherein said illumination optical system has an aperture for transmitting said light beam, at a non-conjugate position with said at least one mask.

6. An exposure apparatus according to claim 1, wherein said illumination optical system includes illumination area setting means for setting an illumination area of said at least one mask by said light beam, and said light attenuation means is provided at a position substantially conjugate with said illumination area setting means.

7. An exposure apparatus provided with an illumination optical system for irradiating at least one mask with a light beam from a light source; illumination area setting means provided in a position within said illumination optical system substantially conjugate with said at least one mask; and a projection optical system for projecting images of areas on said at least one mask illuminated by said light beam onto a photosensitive substrate, and adapted to expose different positions on said photosensitive substrate to images that are mutually connected, by varying steppingly-and-repeatingly the position of said photosensitive substrate with respect to said at least one mask, comprising:

light attenuation means provided in the vicinity of a position conjugate with said illumination area setting means and adapted to gradually decrease the amount of light in a peripheral portion of an image of a mask, projected onto said photosensitive substrate, as the distance from the center of said image increases;

light attenuation position regulating means for regulating position of a light amount decrease by said light attenuation means; and a stage device for positioning said photosensitive substrate with respect to said at least one mask, said stage device being adapted to position said photosensitive substrate in such a manner that peripheral portions of said images mutually overlap.

8. An exposure apparatus comprising:

illumination optical means for irradiating at least one mask with a light beam from a light source;

illumination area setting means provided at a position within said illumination optical means substantially conjugate with said at least one mask, and adapted to set an area on a mask to be illuminated by said light beam;

exposure means for exposing a photosensitive substrate to images of areas on said at least one mask; and movement control means for moving said illumination area setting means in the course of said exposing and adapted to effect said moving in such a manner that the amount of light in a peripheral portion of an image varies substantially continuously according to position within said image.

9. An exposure apparatus according to claim 8, wherein said exposing is conducted in such a manner that peripheral portions of different images of said areas on said at least one mask mutually overlap, and an amount of said moving corresponds to an amount of said overlap.

10. An exposure apparatus according to claim 8 further comprising stepping means for steppingly-and-repeatingly causing images of said areas on said at least one mask to be projected onto different areas on said photosensitive substrate so that peripheral portions of images projected onto different areas on said photosensitive substrate mutually overlap, and wherein said movement control means moves said illumination area setting means in such a manner that an amount of light in said overlapping peripheral portions is substantially equal to an amount of light in portions of said images other than said peripheral portions.

11. An exposure apparatus according to claim 8, wherein said illumination area setting means includes two sets of mutually opposed edges, the edges of at least one set being provided with light attenuation means for gradually decreasing an amount of light in a peripheral portion of an image projected onto said photosensitive substrate as the distance from the center of said image increases.

12. An exposure apparatus according to claim 10, wherein said movement control means is adapted to effect said moving in such a manner that the amount of light varies in accordance with a higher-order function.

13. An exposure apparatus provided with an illumination optical system for irradiating at least one mask with a light beam from a light source; illumination area setting means provided at a position in said illumination optical system substantially conjugate with said at least one mask and provided with two sets of mutually opposed edges; and a projection optical system for projecting images of patterns on said at least one mask, illuminated by said light beam, onto a photosensitive substrate, and adapted to expose different positions on said photosensitive substrate to images that are mutually connected, by varying steppingly-andrepeatingly the position of said photosensitive substrate, comprising:

light attenuation means provided on one of said two sets of edges of said illumination area setting means and adapted to gradually decrease an amount of light in peripheral portions of an image of an area on a mask, projected onto said photosensitive substrate, as the distance from the center of said image increases;

light attenuation position regulating means for regulating position of said light amount decrease by said light attenuation means;

movement control means for moving said illumination area setting means in the course of an exposure, and adapted to effect said moving in such a manner that an amount of light in a peripheral portion of an image varies substantially continuously according to position within said image; and a stage device for positioning said photosensitive substrate with respect to said at least one mask, said stage device positioning said photosensitive substrate in such a manner that peripheral portions of images mutually overlap on said photosensitive substrate.

* * * * *